(12) United States Patent
Furumoto et al.

(10) Patent No.: US 7,177,784 B2
(45) Date of Patent: Feb. 13, 2007

(54) MECHANICAL MODEL SIMULATOR, INTERLOCK SYSTEM SETTING METHOD, AND STORAGE MEDIUM THEREFOR

(75) Inventors: Yukihiko Furumoto, Kawasaki (JP); Naoyuki Nozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 655 days.

(21) Appl. No.: 10/626,586

(22) Filed: Jul. 25, 2003

(65) Prior Publication Data
US 2004/0153297 A1    Aug. 5, 2004

(30) Foreign Application Priority Data
Jul. 26, 2002    (JP)    ............... 2002-218631

(51) Int. Cl.
G06F 17/10    (2006.01)
G06F 17/50    (2006.01)

(52) U.S. Cl. ............................. 703/2; 703/1

(58) Field of Classification Search ............ 703/1, 703/2
See application file for complete search history.

(56) References Cited

U.S. PATENT DOCUMENTS
5,859,515 A * 1/1999 Takizawa et al. ......... 318/560

FOREIGN PATENT DOCUMENTS
| JP | 5-266000 | 10/1993 |
| JP | 5-266150 | 10/1993 |
| JP | 11-120216 | 4/1999 |
| JP | 2000-29916 | 1/2000 |

* cited by examiner

Primary Examiner—Hugh Jones
(74) Attorney, Agent, or Firm—Staas & Halsey LLP

(57) ABSTRACT

A GUI unit displays a model representing a three-dimensional form and a moving unit according to the information stored in a part information storage unit, and couples models of arbitrary moving units by a dragging operation using a mouse, etc., thereby specifying a moving unit and a subordinately moving unit. Furthermore, it displays the binding condition of each moving unit and the direction of the propagation of an interlock movement, and extracts and displays with high intensity a shape for determination of a geometric binding condition.

3 Claims, 29 Drawing Sheets

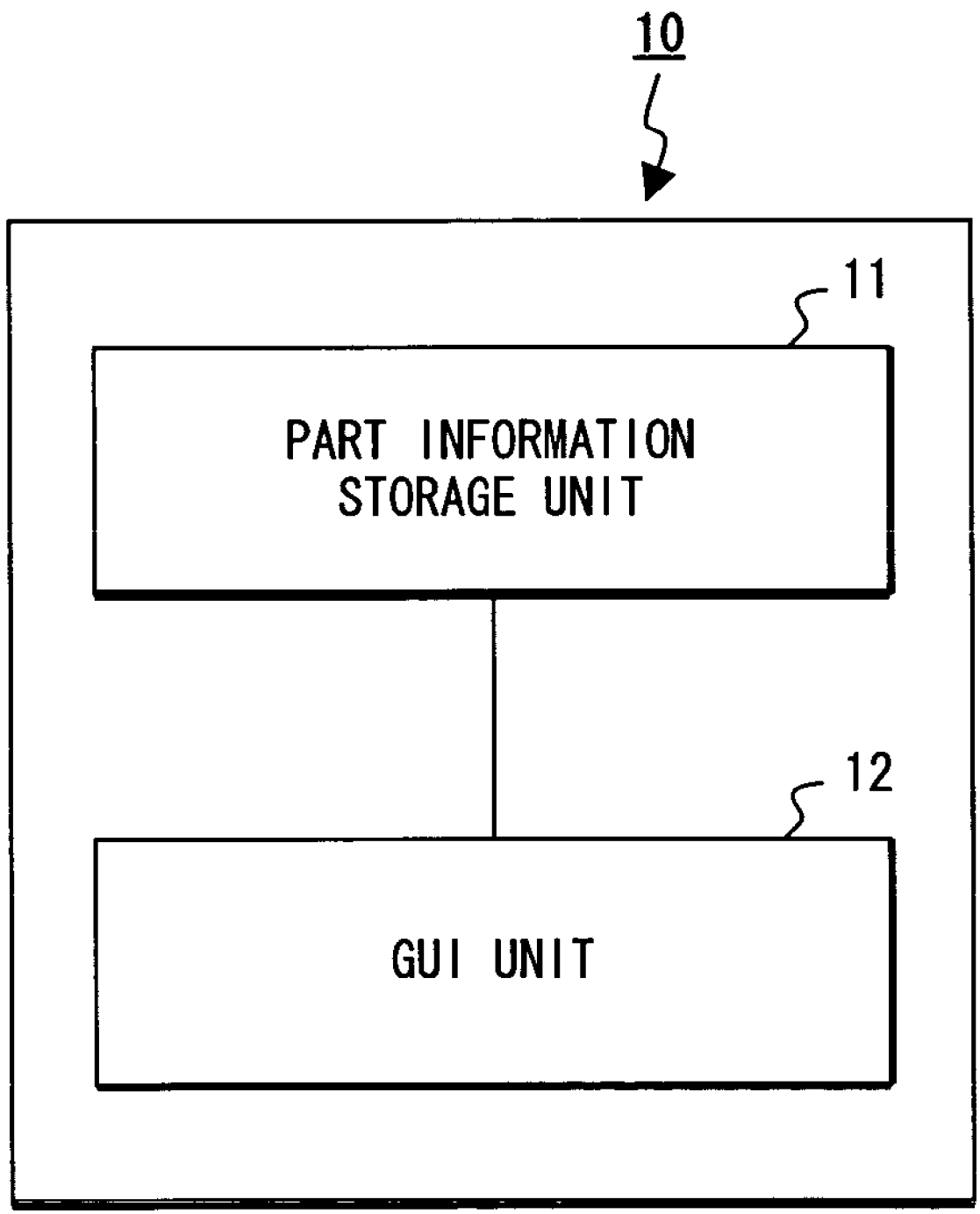
F I G. 1 4

| MOVING UNIT A | MOVING UNIT B |
|---|---|
| 0.00 | −0.06 |
| 0.01 | −0.03 |
| 0.02 | 0.00 |
| 0.03 | 0.03 |
| : | : |

F I G.  2 5 A

| MOVING UNIT B | MOVING UNIT C |
|---|---|
| 0.00 | 0.00 |
| 0.01 | 0.01 |
| 0.02 | 0.02 |
| 0.03 | 0.03 |
| : | : |

F I G.  2 5 B

DATA STRUCTURE OF SHAPE DATA

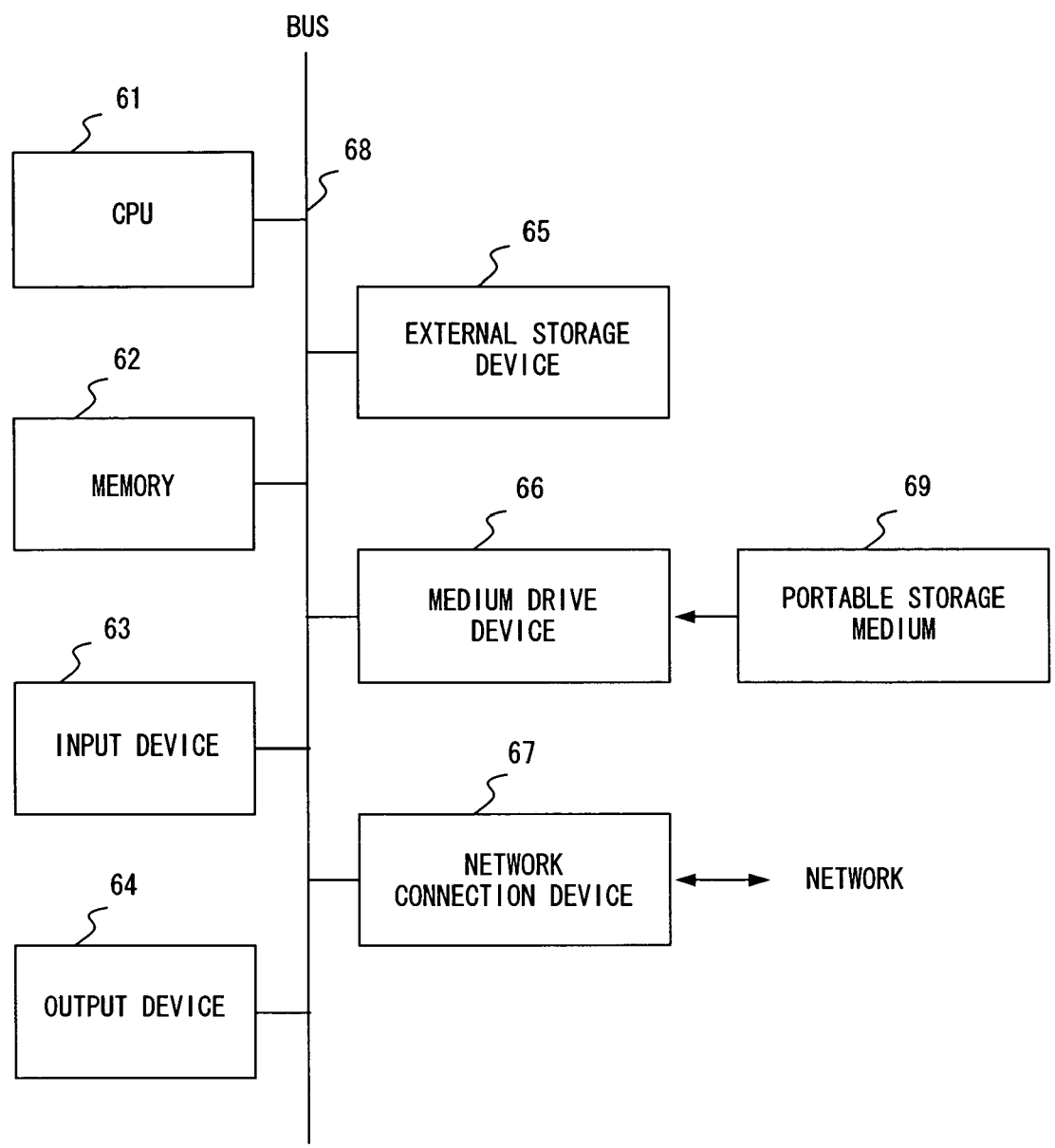
F I G. 2 8

MECHANICAL MODEL SIMULATOR, INTERLOCK SYSTEM SETTING METHOD, AND STORAGE MEDIUM THEREFOR

BACKGROUND OF THE INVENTION

1. Field of the Invention

The present invention relates to a mechanical model simulator, and more specifically to a system, method, program, etc. for simulating the interlock system for the simulator.

2. Description of the Related Art

Recently, the three-dimensional CAD system has been widely used in designing mechanisms of devices. In the three-dimensional CAD system for mechanical design, the shape, size, installation position/relative direction, etc. of each part are set. Normally, there are several moving parts, and it is necessary to check whether or not the moving parts can operate as the designer desires or the moving parts interfere with each other after the assembly of each device. In this connection, with the development of the computer graphics (CG) and simulation technology, the operation of the device can be checked by operating the moving parts by simulation and displaying them on the CG screen without trial production of a device.

FIGS. 1 through 13 show the GUI screen of the three-dimensional CAD system (mechanical model simulator) for the mechanical design and the setting procedure by a user.

First, in the initial state, the three-dimensional shape data (shape, size, relative position, direction, etc.) of each part shown in FIG. 1 has already been generated, and stored in an arbitrary storage area. However, in the initial state, the three-dimensional configuration data shown in FIG. 1 has not been generated. Therefore, in the initial state, each part is only displayed in each position as shown in a three-dimensional CG display area 82 shown on the right in FIG. 2 based on the three-dimensional shape data file (hiki_lever_2_prt~gear_al_prt) of each part shown in the GUI screen (initial screen) 80 shown in FIG. 2.

In this state, a user, etc. selects one part on which a moving part (joint) is to be set. A file can be selected in the tree graphic display area 81 or a part can be directly specified in the three-dimensional CG display area 82.

Thus, a selected part can be displayed in a three-dimensional CG display area 91 as shown on a GUI screen 90 shown in FIG. 3. FIG. 3 shows the state in which a three-dimensional shape data file 'hiki_lever_2_prt' is selected. When a 'next screen' button 92 is clicked, control is passed to a GUI screen 100 shown in FIG. 4, and the user specifies the moving part in a part selected on the GUI screen 100. Then, various settings are made. In making the settings, a moving part (in this example, a hole 103) and an axis 104 are set as shown in a three-dimensional CG display area 101 as a result of the settings although not specifically described. Furthermore, although not shown in the attached drawings, the rotation direction, etc. are also set.

When the settings can be completed, a 'next screen' button 102 is clicked, control is passed to a GUI screen 110 shown in FIG. 5, and a user selects an installing part (hereinafter referred to as a base part) for the moving part of the above mentioned part on the GUI screen 110. FIG. 5 shows the state in which a three-dimensional shape data file '140kadai_ue_2_prt' is selected.

When a base part is selected, a 'next screen' button 111 is clicked, the installation position of the moving part on the base part is set on the screen not shown in the attached drawings, thereby displaying a GUI screen 120 shown in FIG. 6.

Although not shown in detail in the attached drawings, the user selects on the GUI screen 120 the 'minimum value' and the 'maximum value' which are the setting items of a moving range, and specifies the values, thereby setting the moving range of the moving part (joint) of the base part. The moving range is set in rotation angle centering on the axis of a moving part. Otherwise, for example, when a movement is linear, the moving position can be set.

Then, clicking a 'completion' button 121 terminates the setting operation of a moving part. By the setting operation, for example, the information about a moving part can be generated and added as shown in a tree graphic display area 131 of a GUI screen 130 shown in FIG. 7. That is, as shown in FIG. 7, the 'Rotate0017' which is the setting information such as the installation position, moving direction/range, etc. of the moving part of the part 'hiki_lever_2_prt' of the base part '140kadai_ue_2_prt' is added as shown in FIG. 7 (that is, the three-dimensional configuration data and tree structure shown in FIG. 1). The base part '140kadai_ue_2_prt' and the setting information 'Rotate0017' are managed as the information about the joint name 'JoinAsy0016 specified in FIG. 6.

The above mentioned processes are sequentially performed also on other parts, thereby finally storing the part information (three-dimensional shape and position data of each part and the information about the moving parts) in the tree structure indicating the relationship between the base part and its moving part as shown by a GUI screen 140 and a tree graphic display area 141 shown in FIG. 8.

Furthermore, normally, using the above mentioned part information generated and stored in the above mentioned setting operation, the interlock system between each part (drive part) and other parts (subordinately moving parts) interlocked by the operation of the drive part is simulated. The interlocking can also be referred to as relation.

The simulation of the interlock system is described by referring to FIGS. 9 through 13.

First, on a relation type setting screen 150 shown in FIG. 9, a button indicating an arbitrary relation type is selected, Then a 'next screen' button 151 is clicked to pass to a relation drive part specification screen 160 shown in FIG. 10. In a three-dimensional CG display area 161 on the relation drive part specification screen 160, all parts except the base part are displayed as shown in FIG. 10 according to the above mentioned part information. In the three-dimensional CG display area 161, the user is prompted to specify the drive part to be defined relating to the interlock system. When the user clicks a 'next screen' button 162, control is passed to a subordinately moving part setting screen 170 shown in FIG. 11, and the subordinately moving part interlocked by the drive part is specified. Then, in a relation setting target display area 172 shown in FIG. 11, only the specified drive part and the subordinately moving part are displayed separate from other parts. In this example, the above mentioned 'hiki_lever_2_prt' is selected as a drive part, and a substantially circular part is selected as an interlocked subordinately moving part. By clicking a 'next screen' button 173, control is passed to the next screen, and the interlock system between the selected drive part and subordinately moving part is defined.

First, a moving range is set on a moving range setting screen 180 shown in FIG. 12. Then, an interlock system is defined in an automatic computation or a manual operation.

When the interlock system is set in a manual operation, the user manually makes settings on an interlock system setting screen 190.

Although a moving range has already been set as shown in FIG. 6, it is the moving range of a single drive part of a base part. When a subordinately moving part is interlocked, the moving range is normally reduced. Therefore, the moving range is first set when a drive part interlocks a subordinately moving part, and then the interlock system in the moving range is defined.

First, on the moving range setting screen 180 shown in FIG. 12, the user first moves each part to the initial position in a three-dimensional CG display area 181, clicks a 'starting point fetch' button 183, and sets the initial position of each part. Simultaneously, each part is moved to the end position in the three-dimensional CG display area 181, a 'end point fetch' button 184 is clicked, and the end position of each part is set, thereby setting a moving range.

When the moving range is set, for example, an interlocking operation is automatically computed using an interference check algorithm to automatically define the interlock system or manually set it.

When a manual setting is made, the user moves a drive part little by little from, for example, the initial position on the interlock system setting screen 190, and manually determines the position of the subordinately moving part corresponding to the position each time the drive part is moved. That is, while moving the subordinately moving part, the correct position of the pin in the groove is to be visually detected (when the position is determined, the 'fetch' button is clicked to record the position of the moving part and the position (interlock system) of the subordinately moving part as shown on the right in FIG. 13). The operation is repeatedly performed to define and store the interlock system.

For the user, the display in the three-dimensional CG display area 181 of the moving range setting screen 180 only shows the three-dimensional CG of two parts to be defined in the interlock system. Therefore, it has not been clear based on which these parts operate (where are the moving units), on what binding conditions the operations propagate, what relationship is set with other parts, etc. Furthermore, the operation procedure of setting the relationship between a drive unit and a subordinately moving unit has been complicated.

The descriptions above relates to, for example, the technology of the product (FJVPS/Digital Mockup V10L14a).

SUMMARY OF THE INVENTION

The present invention aims at providing a mechanical model simulator, an interlock system setting method, a storage medium, etc. for the simulator capable of displaying a comprehensible screen showing an operation of the mechanism to the user, easily performing the operation of specifying the relation between a drive unit and a subordinately moving unit, etc.

The mechanical model simulator according to the present invention is configured to include: a part information storage unit for storing three-dimensional shape and position information about each part and the information about a moving unit of each part; and a user interface unit for displaying the three-dimensional shape of each part and a model indicating the moving unit of each part based on the contents stored in the part information storage unit, and specifying models of a plurality of moving units by a pointing device, thereby specifying the drive unit and the subordinately moving unit interlocked with the drive unit.

A method of displaying a model indicating a moving unit and specifying it using a mouse, etc. is easier in understanding the operation of a mechanism and specifying and performing the drive unit—subordinately moving unit.

Furthermore, for example, the configuration can be designed such that the user interface unit can display the binding condition of the moving unit and the direction of the propagation of the above mentioned interlocking movement, specify a geometric binding condition, display the geometric binding condition, extract the shape for determining the specified geometric binding condition, and display it with high intensity.

With the above mentioned display, the interlocking operation of a complicated mechanism can be immediately understood.

The above mentioned conventional problems can also be solved by reading a program from a computer-readable storage medium storing the program used to direct a computer to perform the control similar to the function performed with each configuration of the present invention.

BRIEF DESCRIPTION OF THE DRAWINGS

FIG. 14 is a block diagram of the function of the mechanical model simulator according to an embodiment of the present invention;

FIGS. 25A and 25B shows an example of an interlock system table;

FIG. 28 shows an example of the configuration of the hardware of a computer realizing the mechanical model simulator.

DESCRIPTION OF THE PREFERRED EMBODIMENT

The embodiments of the present invention are described below by referring to the attached drawings.

FIG. 14 is a block diagram of the function of the mechanical model simulator according to an embodiment of the present invention.

A mechanical model simulator 10 shown in FIG. 14 comprises a part information storage unit 11 and a GUI unit 12. The part information storage unit 11 stores three-dimensional shape and position information, and information about a moving unit of each unit. That is, it stores the information set in the process shown in FIGS. 2 through 8.

The GUI (graphical user interface) unit 12 displays the three-dimensional shape of each part according to the above mentioned various information stored in the part information storage unit 11, and displays a model of representing the moving unit of each part. By specifying the models of a plurality of moving units by a pointing device (for example, a dragging operation, etc.), a drive unit and a subordinately moving unit interlocked with the drive unit can be specified.

Furthermore, the GUI unit 12 displays the binding condition of each moving unit and the direction of the propagation of the movement of the interlock system. The binding condition of the moving unit refers to, for example, the operation such as traveling in parallel, rotation, etc., and the direction of the operation. The display of the direction of the propagation of an interlocking operation is, for example, displayed by the arrow from the drive unit to the subordinately moving unit.

Additionally, the GUI unit 12 further specifies the geometric binding condition for interlock between the drive unit and the subordinately moving unit, the geometric binding condition is displayed by characters, and the form for determination of the specified geometric binding condition is extracted and displayed with high intensity. The geometric binding condition is determined by the form of a gear, groove, and cum, etc. For example, in the case of a groove, the 'groove' is declared, and the shape of the groove is displayed with high intensity (highlight display, etc.).

Figure 15:
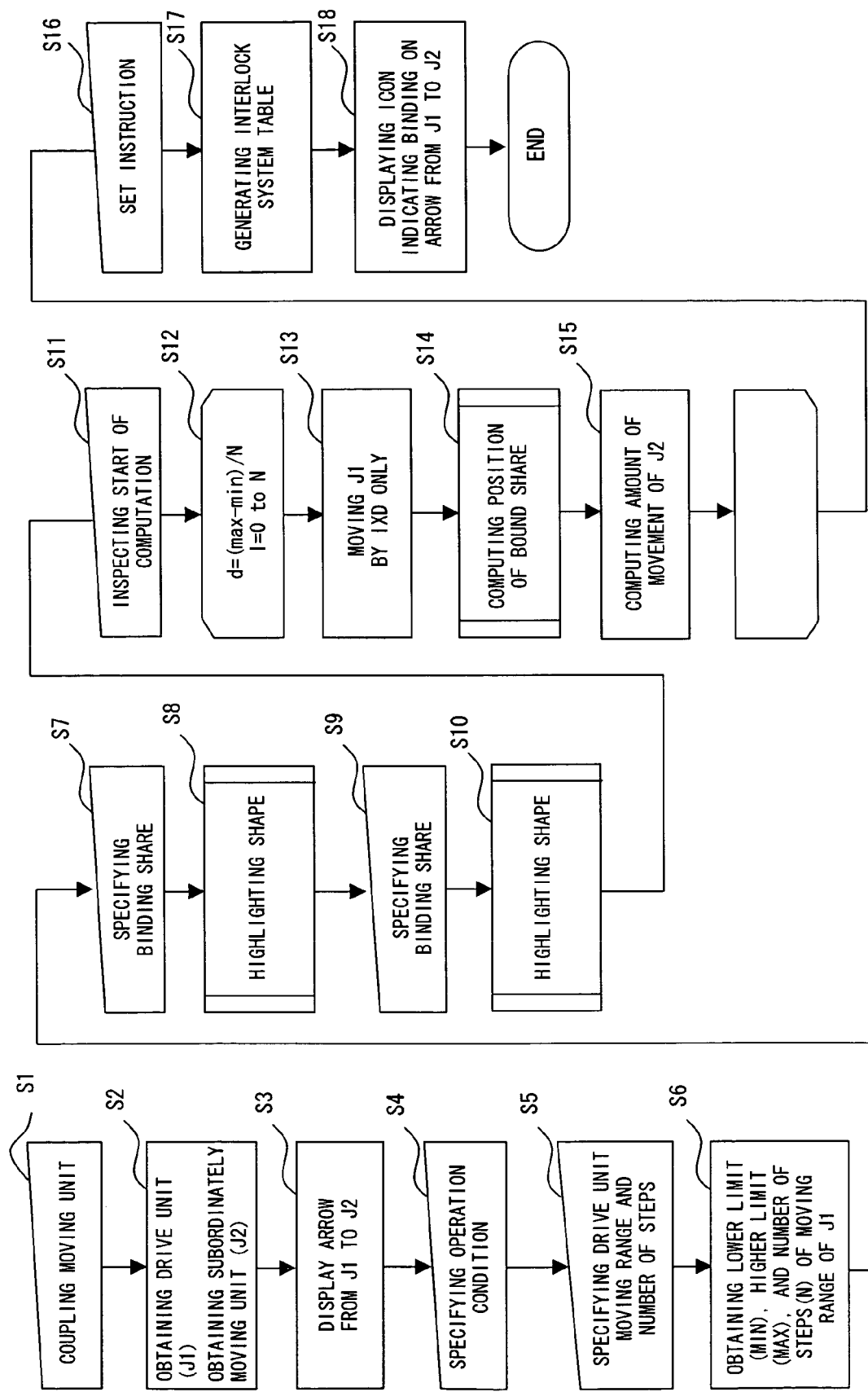
FIG. 15 is a flowchart for explanation of the process procedure of the mechanical model simulator shown in FIG. 14.

FIG. 15 is a flowchart for explanation of the process procedure by the mechanical model simulator.

FIGS. 16 through 24 show the progression of the GUI (graphical user interface) screen displayed on the display unit of a computer, etc.

First, although not shown in drawings, as in the conventional technology, the mechanical model simulator (hereinafter referred to simply as a system) first allows the user to select the type of interlock system (relation) to be set, and displays a GUI screen 20 (initial screen) shown in FIG. 16.

Figure 16:
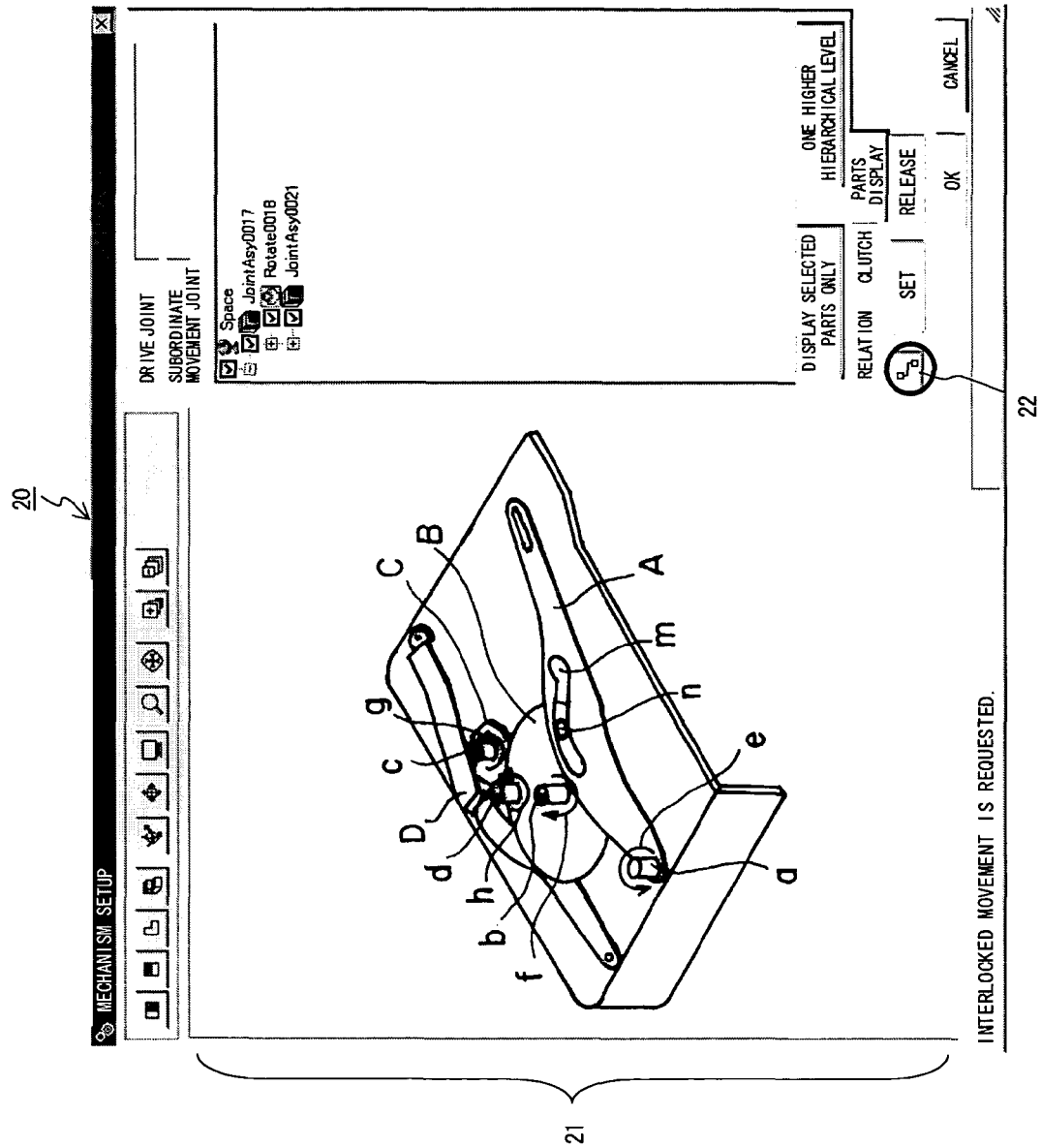
FIG. 16 shows the progression (1) of the displayed GUI screen.

In a display area 21 of the GUI screen 20 shown in FIG. 16, a CG image of each part is displayed in the position according to the part information stored in the part information storage unit 11, and a model representing a moving unit of each part is displayed. That is, a part A, a part B, a part C, and a part D are displayed, and the models representing the moving unit a of the part A, the moving unit b of the part B, the moving unit c of the part C, and the moving unit d of the part D are displayed. The model (three-dimensional CG) representing each moving unit is set and recorded in advance, and any shape is acceptable, but the example shown in the attached drawings is substantially cylindrical. It is displayed such that the user can easily find the position of the moving unit of each part, and no actually cylindrical part exists.

Furthermore, the binding condition of each moving unit (traveling in parallel or rotation, and direction) is displayed in the three-dimensional CG display area 21. In the example shown in FIG. 16, any moving unit rotates. Therefore, displayed are the rotation direction e of the moving unit a, the rotation direction f of the moving unit b, the rotation direction g of the moving unit c, and the rotation direction h of the moving unit d. The part A has the groove m, and the part B has a pin n for the groove m.

On the above mentioned initial screen, the user first clicks a interlock joint specification button 22 using a pointing device such as a mouse, etc. to set the interlock system of an arbitrary part, and then specifies a drive unit and a subordinately moving unit by performing an operation (dragging operation) (step S1 shown in FIG. 15) for moving the mouse pointer (cursor) from an arbitrary moving unit to another arbitrary moving unit in the three-dimensional CG display area 21. Regardless of the above mentioned operation, for example, two arbitrary moving units can be sequentially specified (by double clicking, etc.).

The system recognizes the first specified moving unit as an drive unit, and the transferred-to moving unit as a subordinately moving unit, and obtains the part information of the drive unit and the subordinately moving unit (recorded as J1 and J2 in FIG. 15) (step S2). Then, according to the obtained data, an arrow from the position of the drive unit to the position of the subordinately moving unit is displayed (step S3). The arrow represents the drive unit, the subordinately moving unit, and the propagation direction of the interlocking movement.

Figure 17:
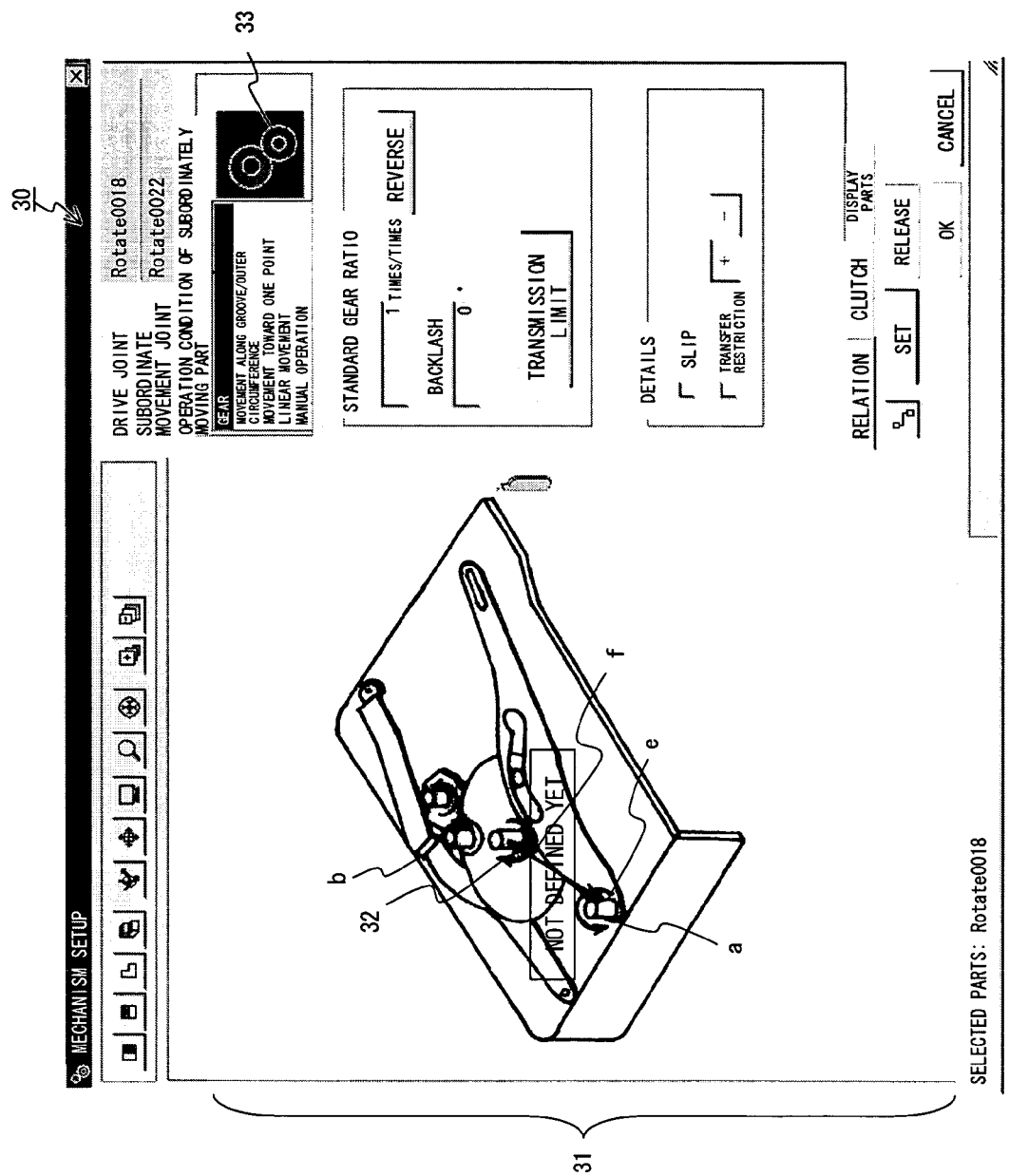
FIG. 17 shows the progression (2) of the displayed GUI screen.

For example, when a dragging operation is performed from the moving unit a of the part A to the moving unit b of the part B, an arrow 32 shown in a three-dimensional CG display area 31 of a GUI screen 30 shown in FIG. 17 is added and displayed. For the user, according to the operation manual, the root of the arrow is the drive unit, and the top of the arrow is a subordinately moving unit. Furthermore, the rotation direction e and f of the moving units a and b can be displayed with high intensity (for example, they are displayed white in FIG. 16, but can be changed into red, etc.). Characters for explanation of the geometric binding condition are displayed later on the arrow 32, but 'not defined yet' is displayed at the current stage (it is not necessary to display the description).

The geometric binding condition determined depending on the shape of the gear/groove/cam, etc. is then set. First, the user specifies the operation condition (step S4). This can be selected and specified in a 'subordinately moving part operation condition' setting area 33 of the GUI screen 30. Since it is 'gear' in the initial state, it is a display state on the right of the GUI screen 30, but the user selects in this example a 'movement along the groove/outer circumference', the GUI screen shows the display state shown in FIG. 18.

Figure 2:
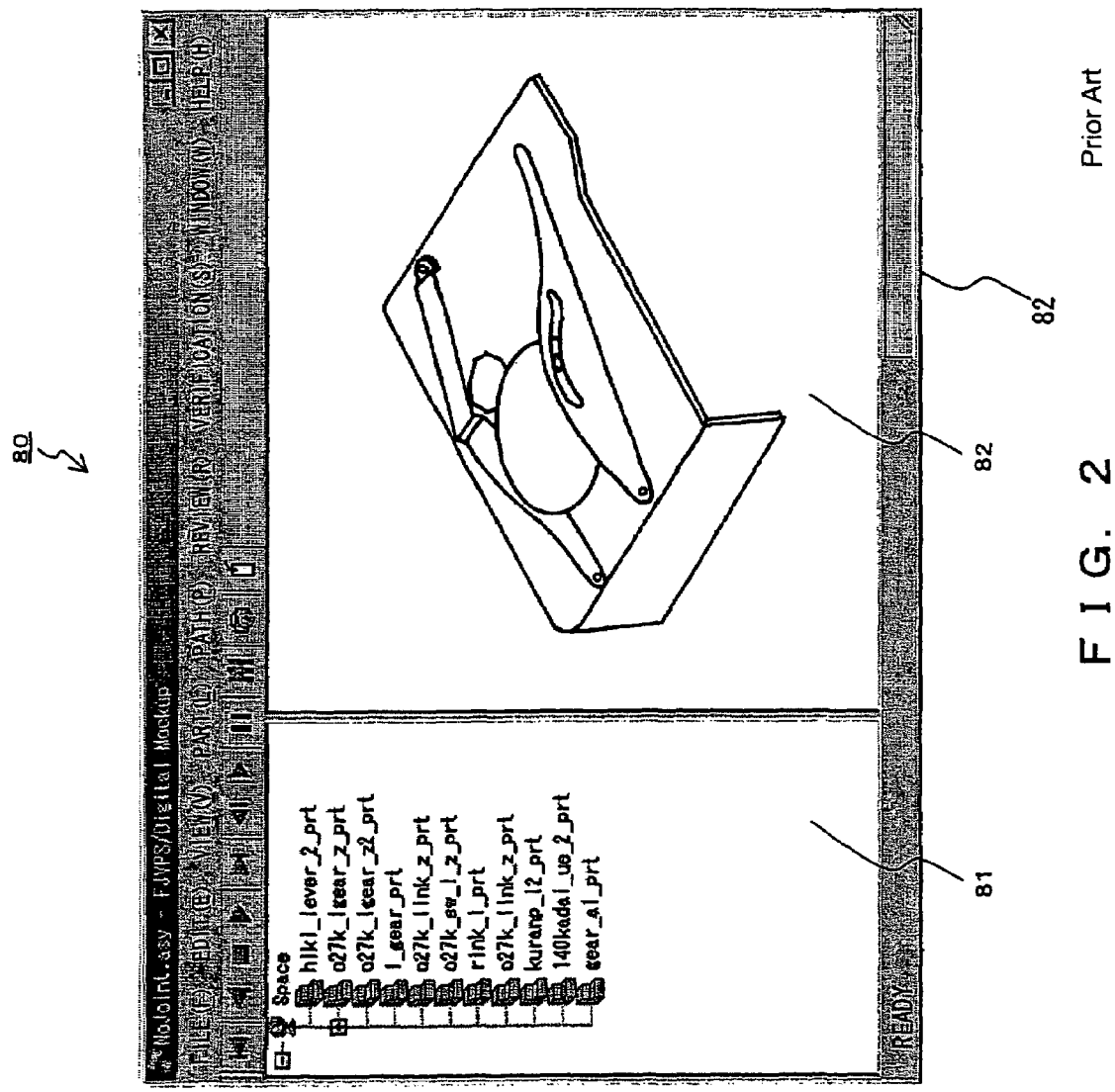
FIG. 2 shows the progression (1) of a GUI screen when a moving unit is set.
Figure 3:
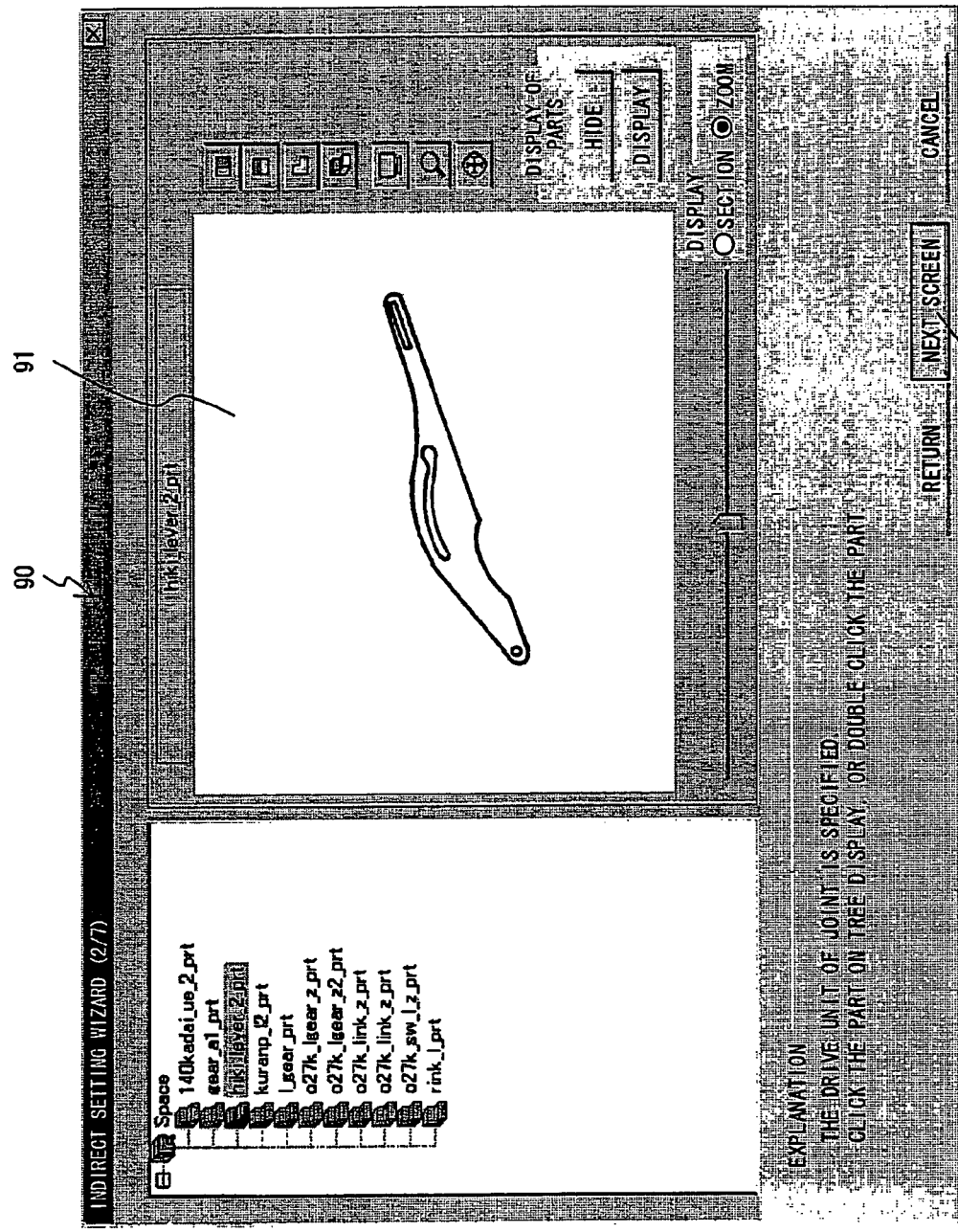
FIG. 3 shows the progression (2) of a GUI screen when a moving unit is set.
Figure 4:
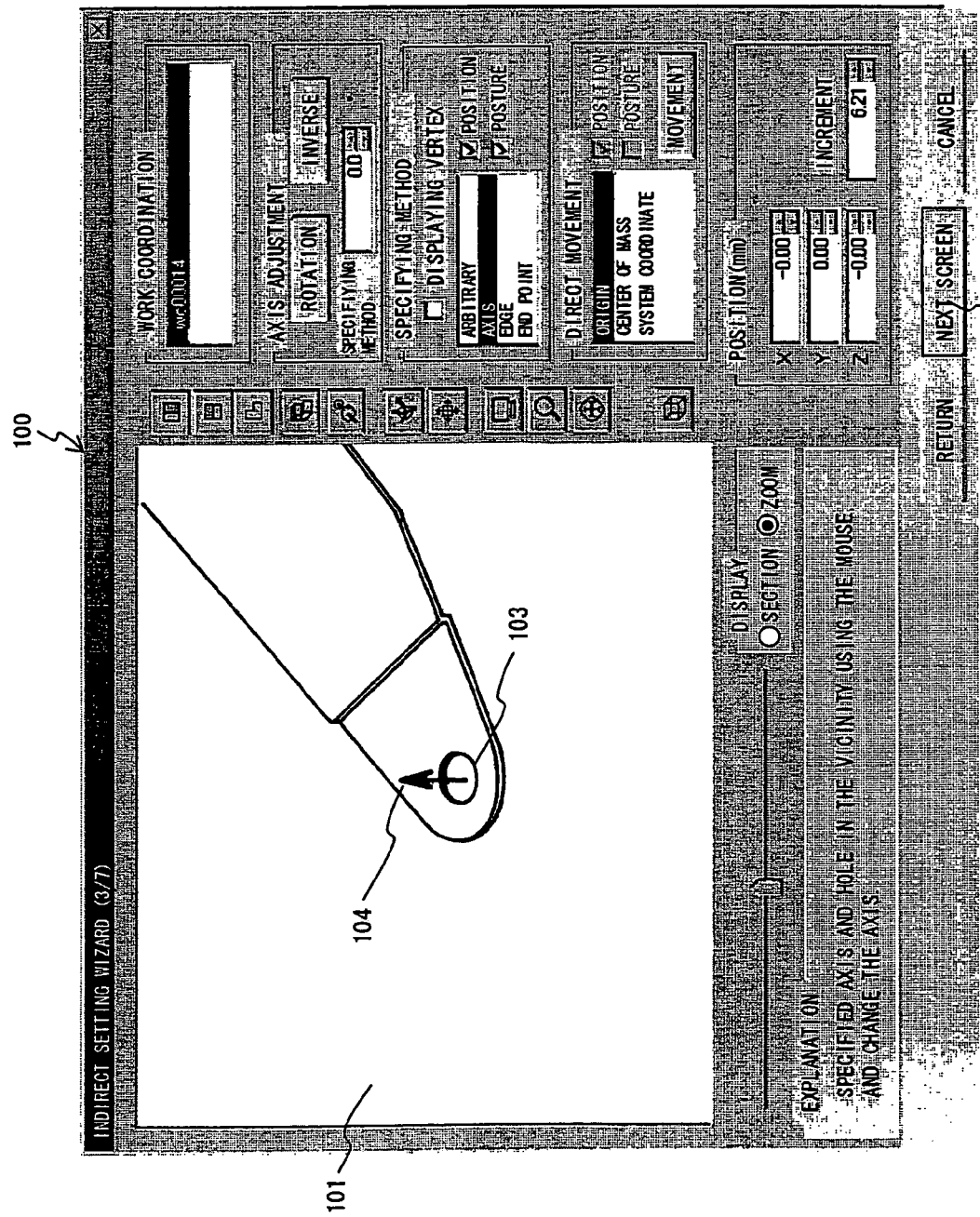
FIG. 4 shows the progression (3) of a GUI screen when a moving unit is set.
Figure 5:
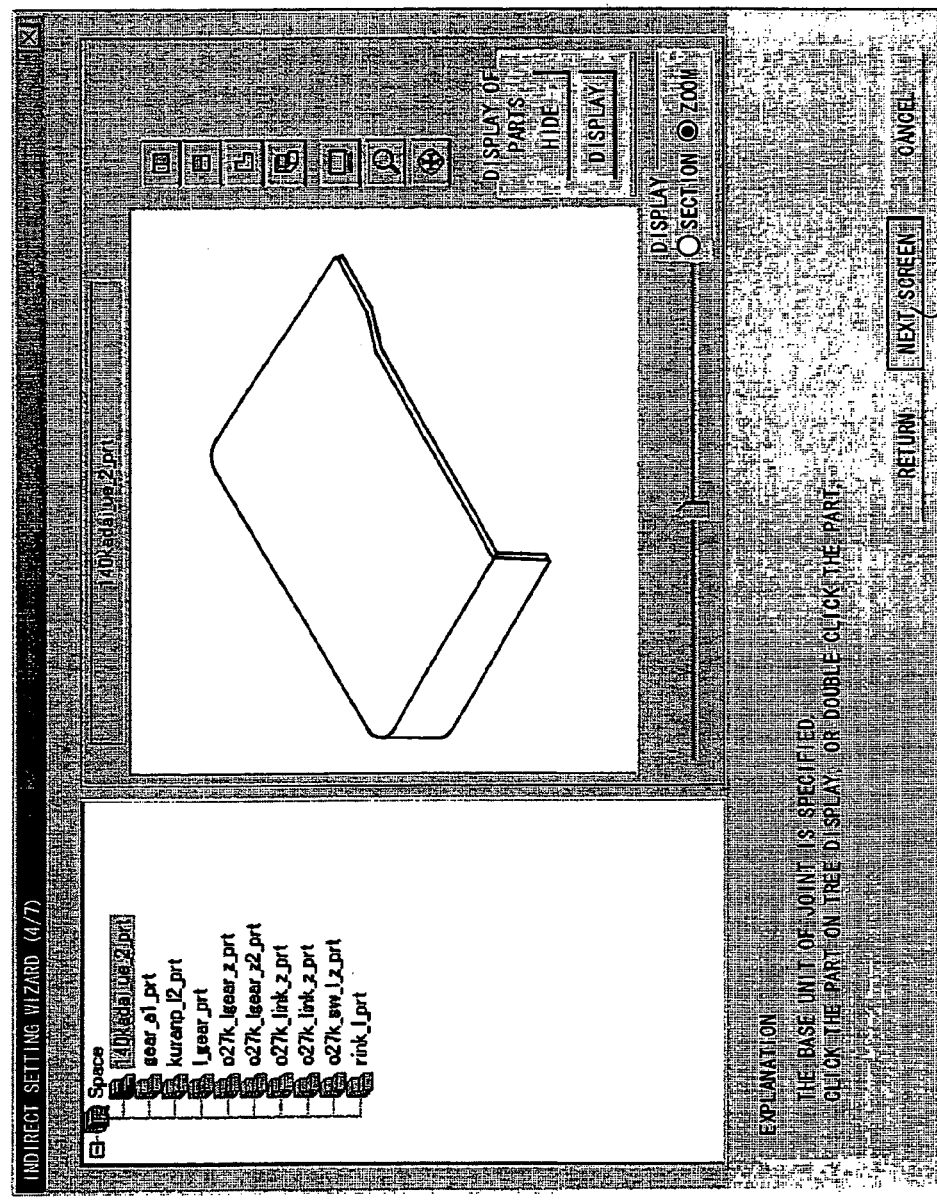
FIG. 5 shows the progression (4) of a GUI screen when a moving unit is set.
Figure 6:
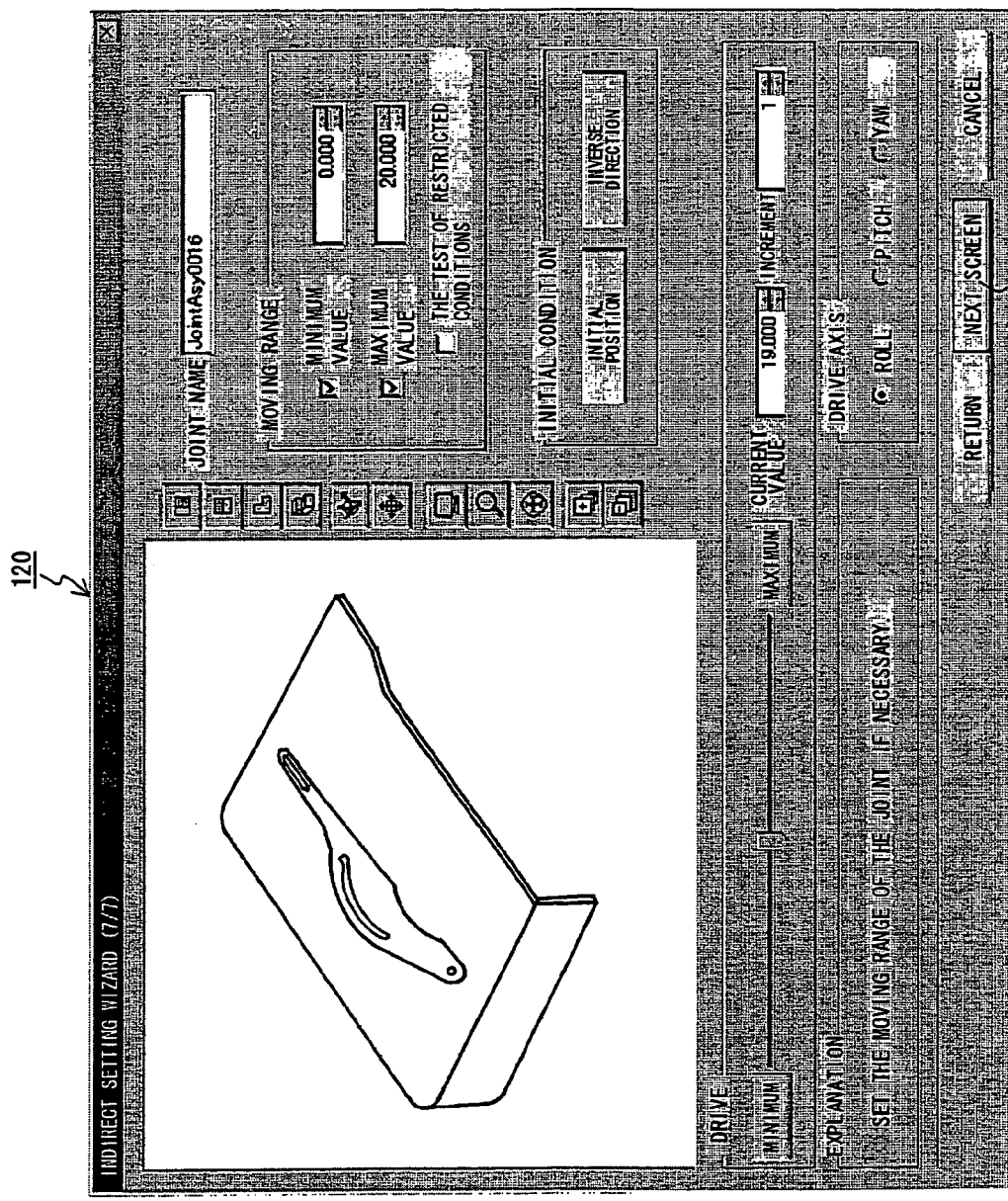
FIG. 6 shows the progression (5) of a GUI screen when a moving unit is set.
Figure 7:
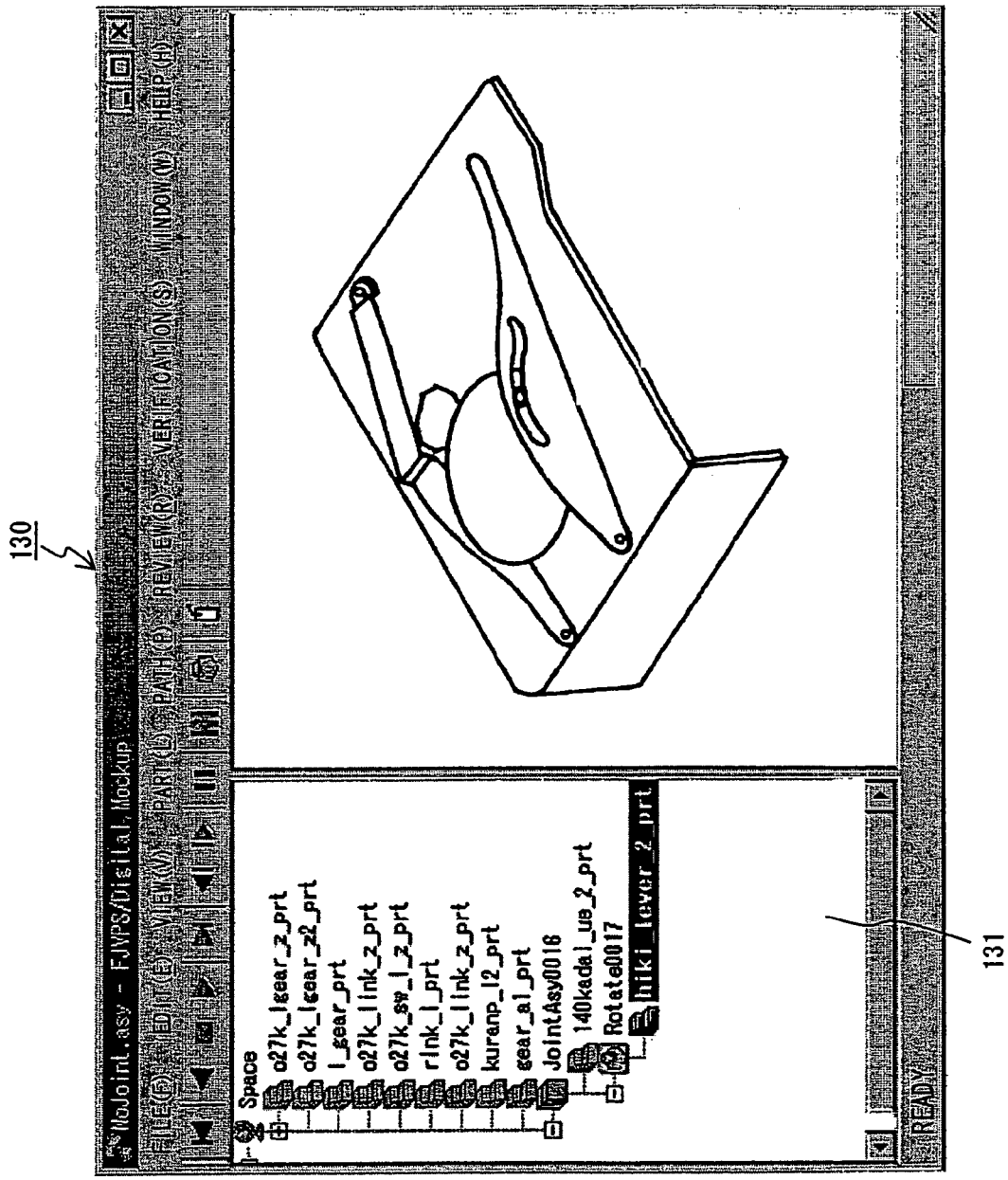
FIG. 7 shows the progression (6) of a GUI screen when a moving unit is set.
Figure 8:
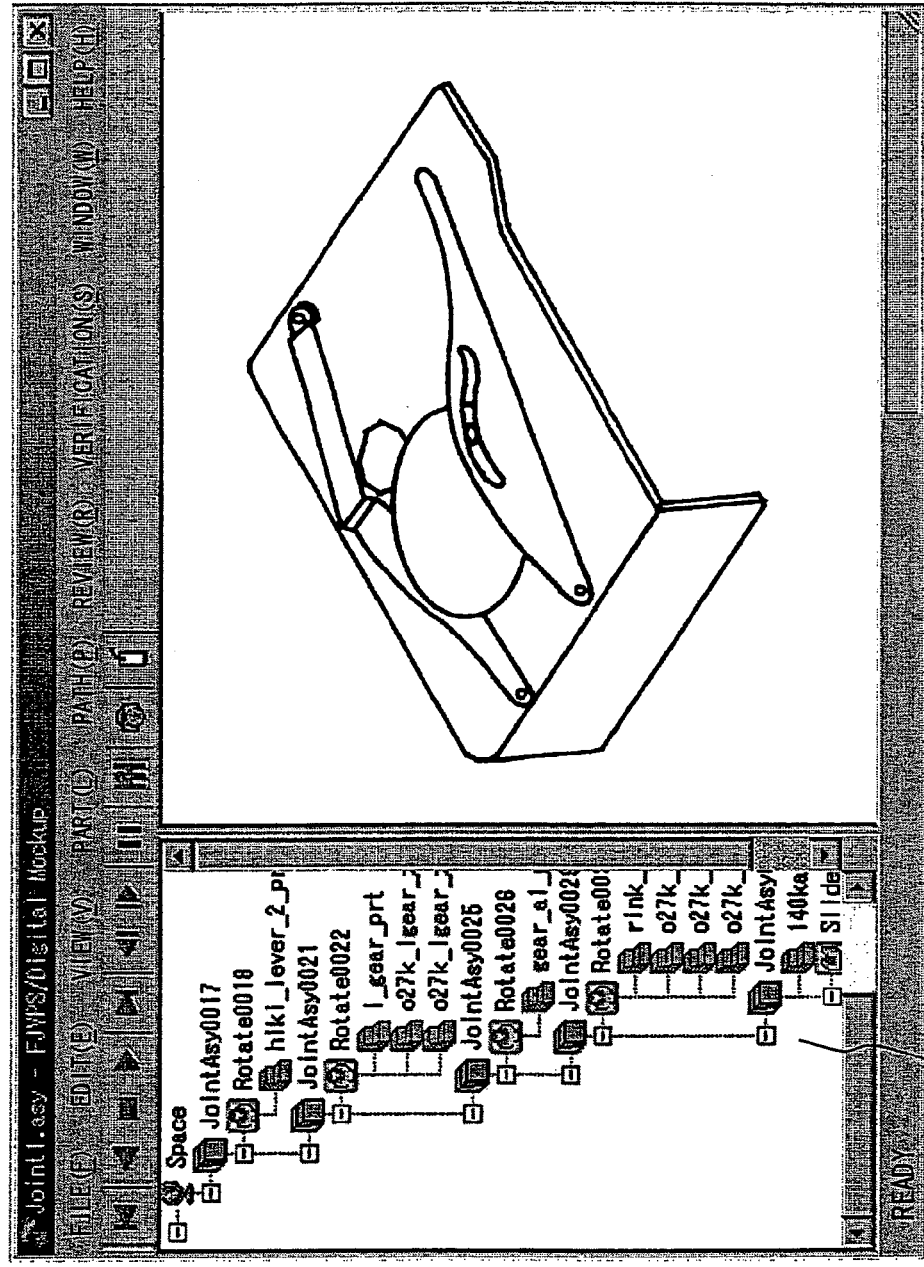
FIG. 8 shows the progression (7) of a GUI screen when a moving unit is set.
Figure 9:
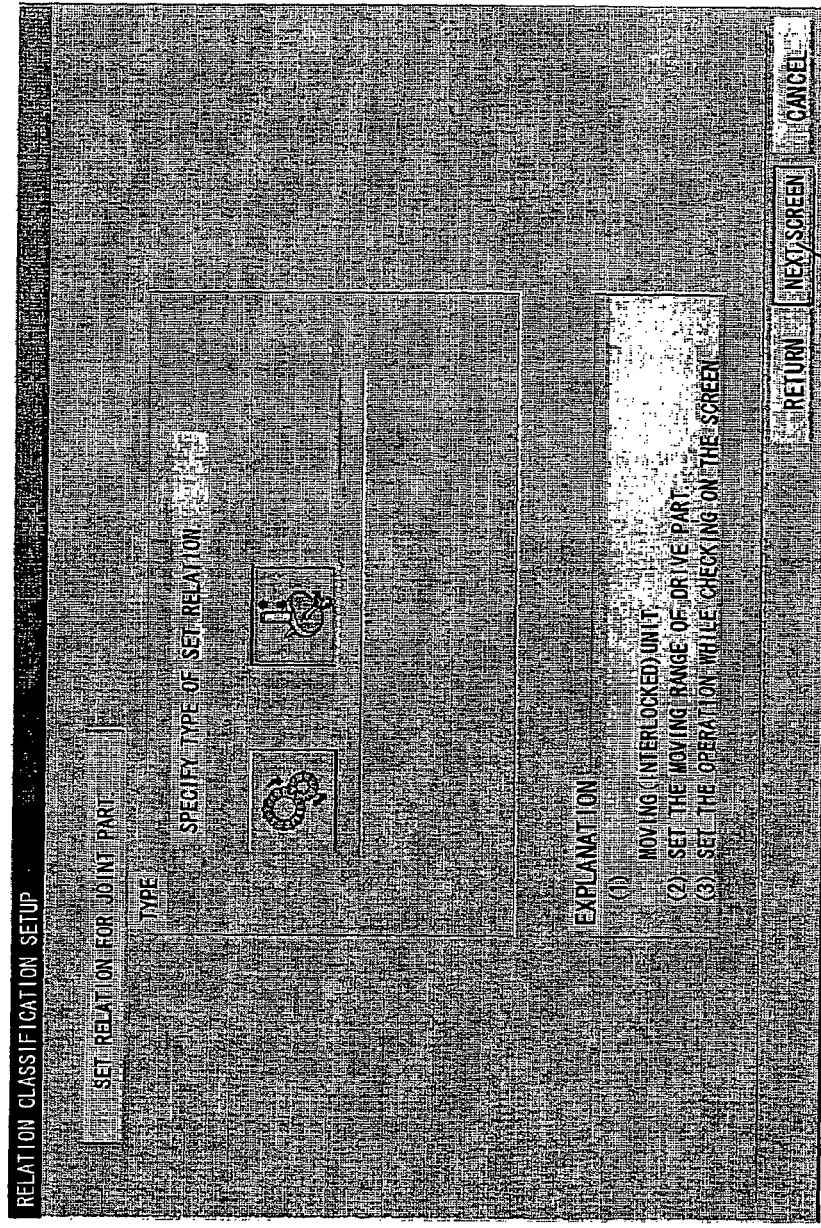
FIG. 9 shows the initial screen when an interlock system is set.
Figure 10:
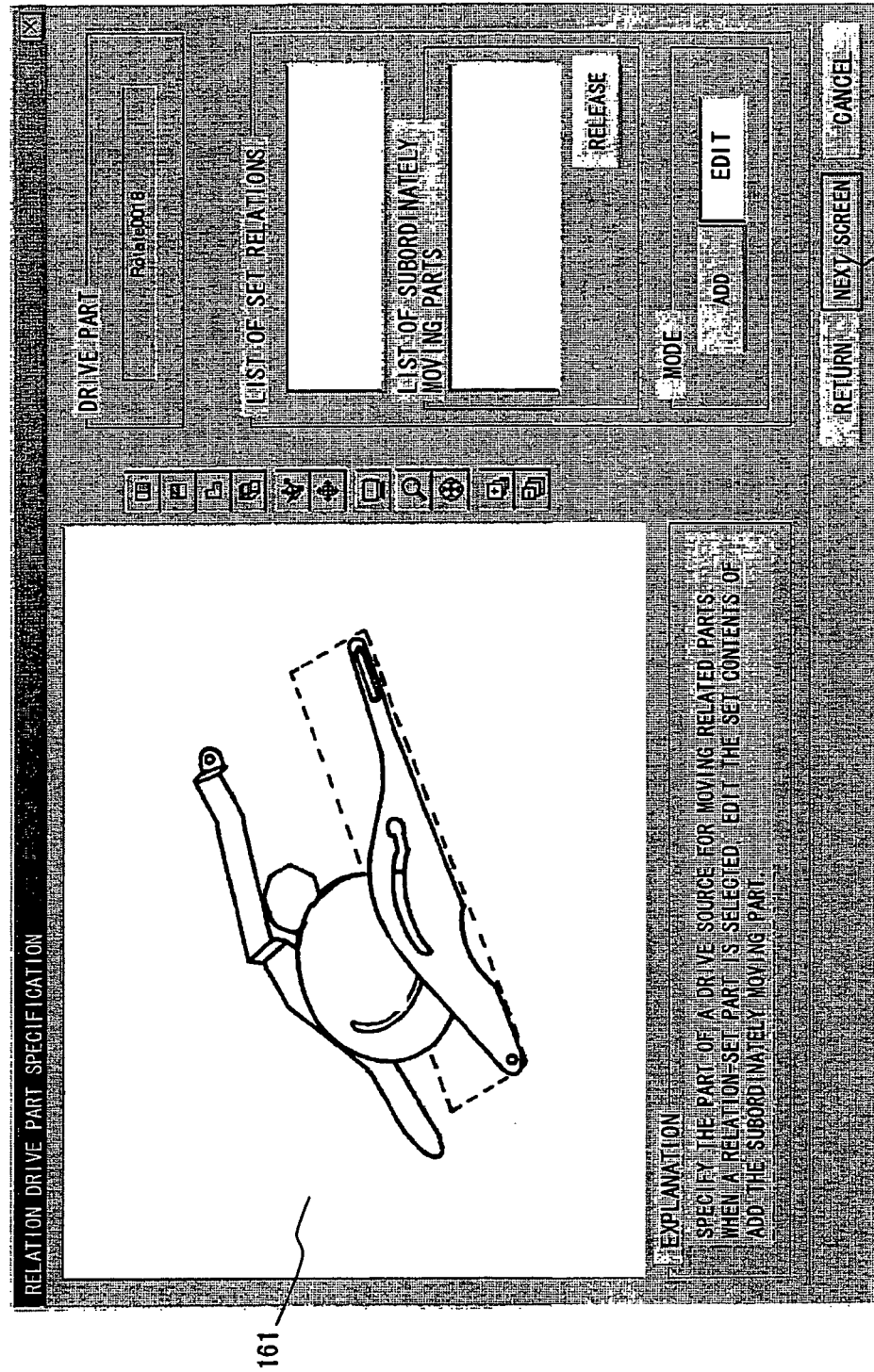
FIG. 10 shows the progression (1) of a GUI screen when an interlock system is set.
Figure 11:
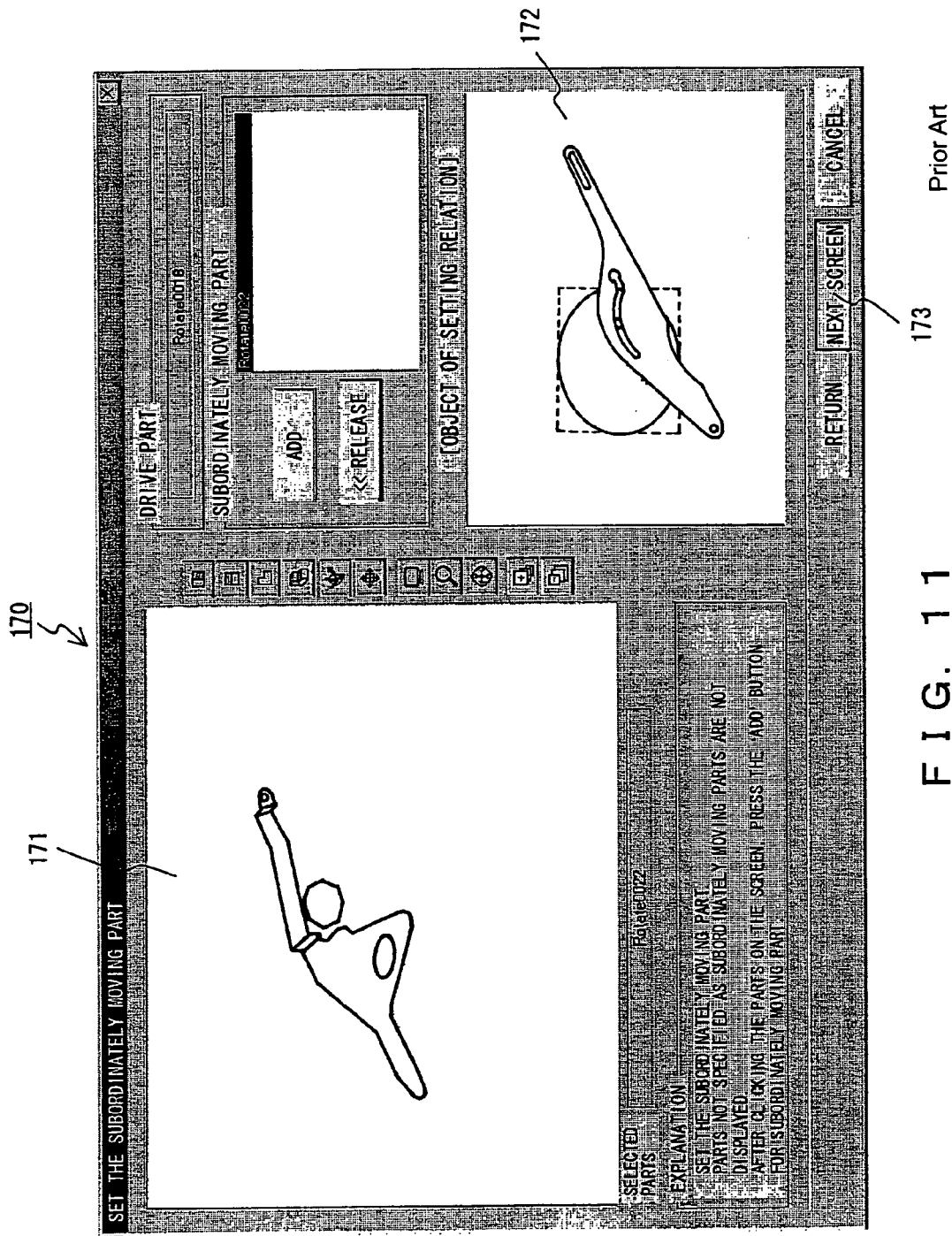
FIG. 11 shows the progression (2) of a GUI screen when an interlock system is set.
Figure 12:
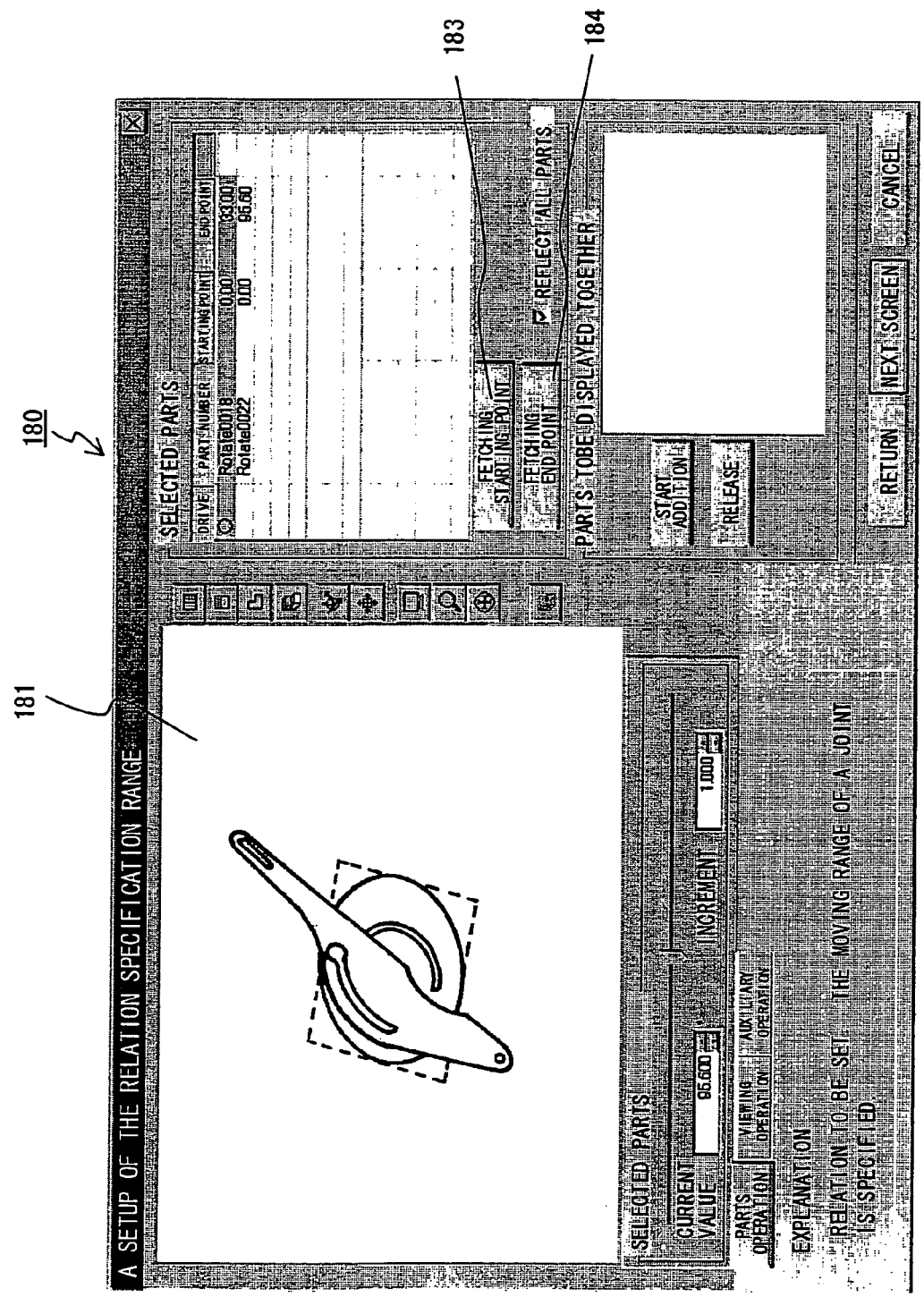
FIG. 12 shows the progression (3) of a GUI screen when an interlock system is set.
Figure 13:
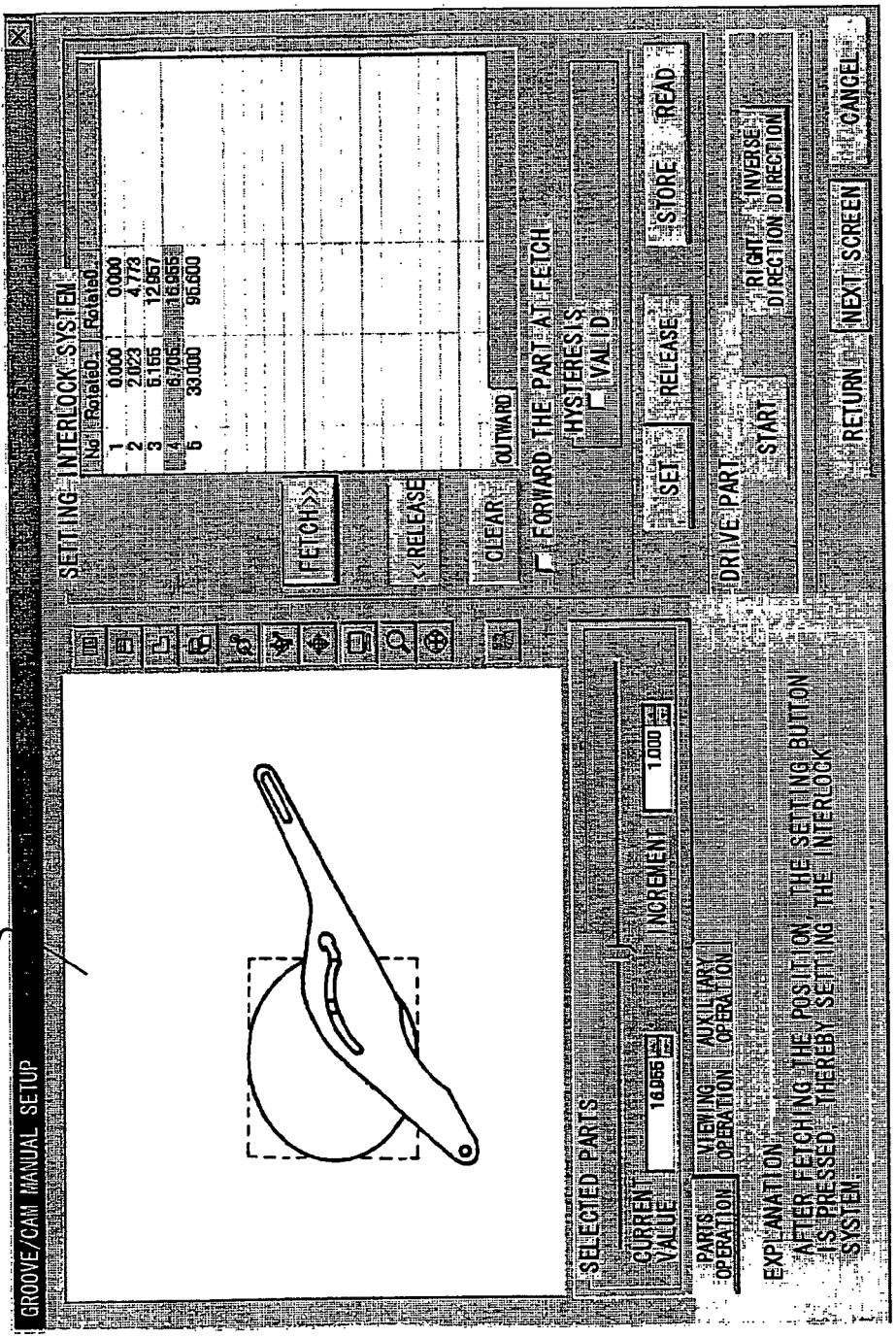
FIG. 13 shows the progression (4) of a GUI screen when an interlock system is set.
Figure 18:
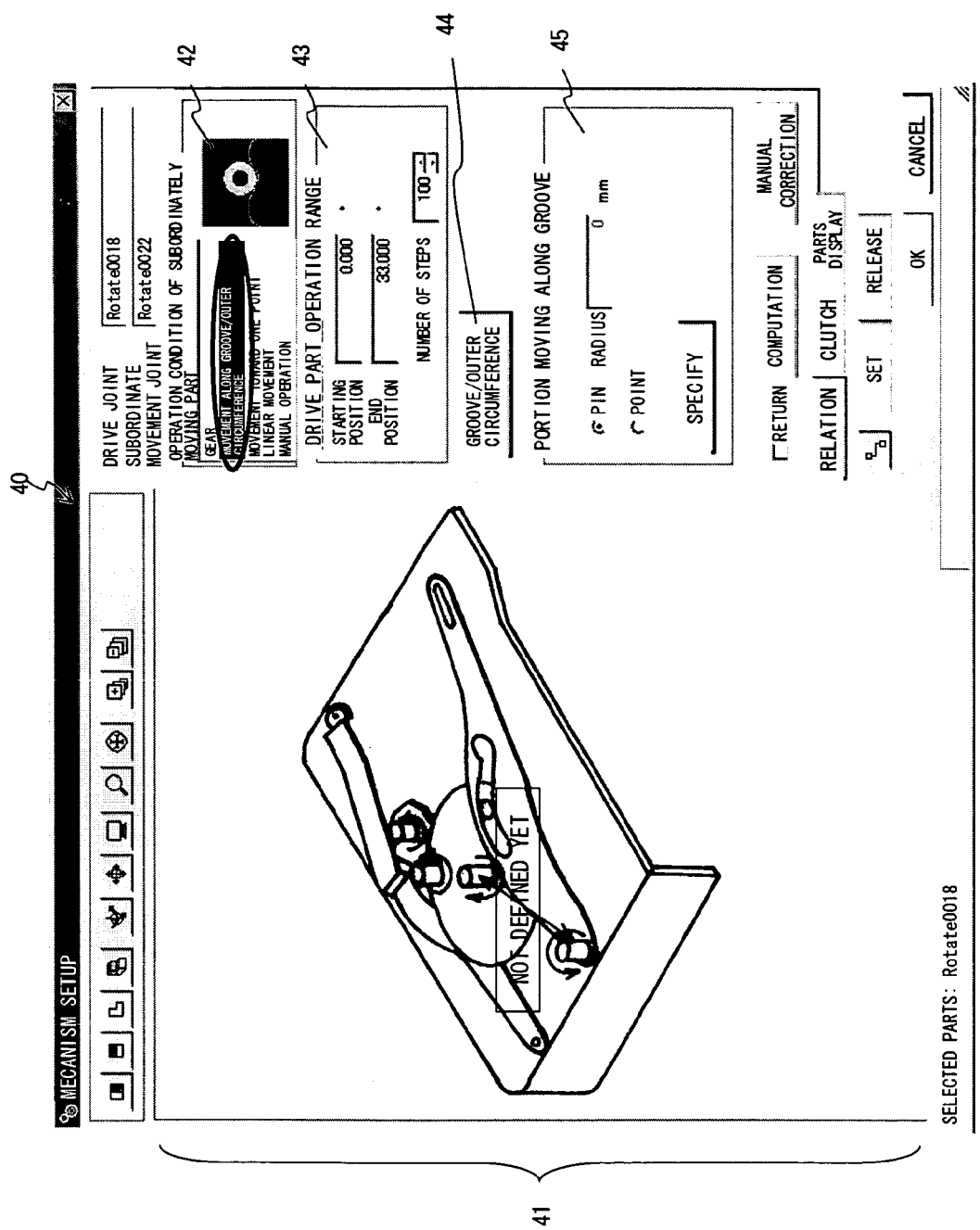
FIG. 18 shows the progression (3) of the displayed GUI screen.
Figure 19:
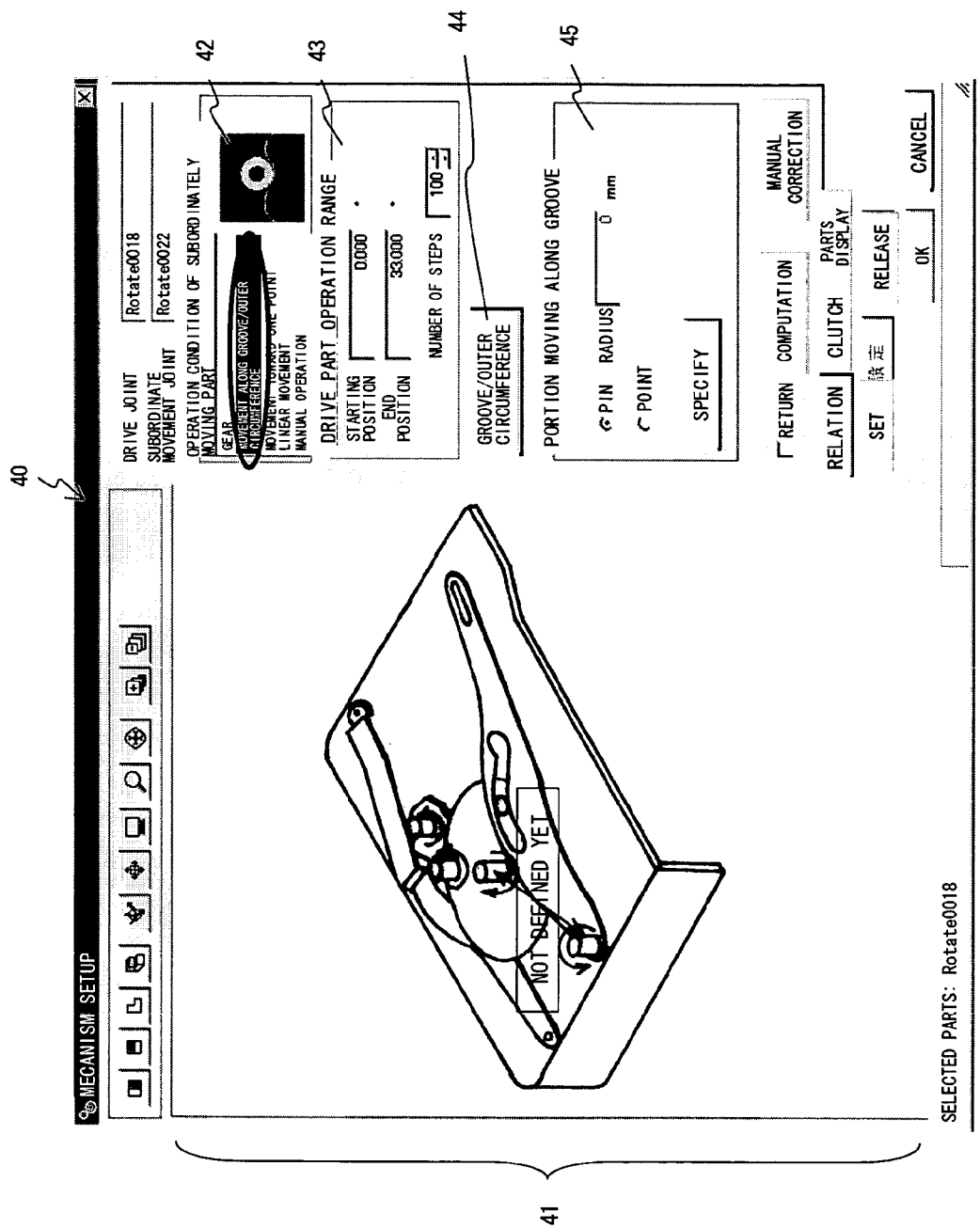
FIG. 19 shows the progression (4) of the displayed GUI screen.

On a GUI screen 40 shown in FIG. 18, the contents of a three-dimensional CG display area 41 have not been changed. As shown on the right on the GUI screen 40, when the user selects and specifies the 'movement along the groove/outer circumference' in the 'subordinately moving part operation condition' setting area 33, a 'moving part operation range' setting area 43, a 'groove/outer circumference specification' button 44, a 'part moving along groove' setting area 45 are displayed. In these states, first, the user sets the 'moving part operation range' setting area 43. That is, the user specifies the moving range of the drive part (starting position, end position), and the number of steps (step S5). By default, the values of the moving range are set and recorded as shown in FIG. 2, etc., and are automatically initialized. Therefore, only the number of steps can be normally set, but the moving range can be newly set at the discretion of the user.

On the system side, the above mentioned starting position, end position, and number of steps are respectively substituted for the variables min, max, and N and stored (step S6). They are used in the process in step S12 later.

Next, the user specifies the geometric binding shape (step S7).

As shown in FIG. 18, after clicking the 'groove/outer circumference specification' button 44, the mouse pointer is moved to the vicinity of the groove or the outer circumference to be specified in the three-dimensional CG display area 41, and the clicking operation, etc. is performed, thereby performing the specification (specifying the groove m in this example).

Figure 20:
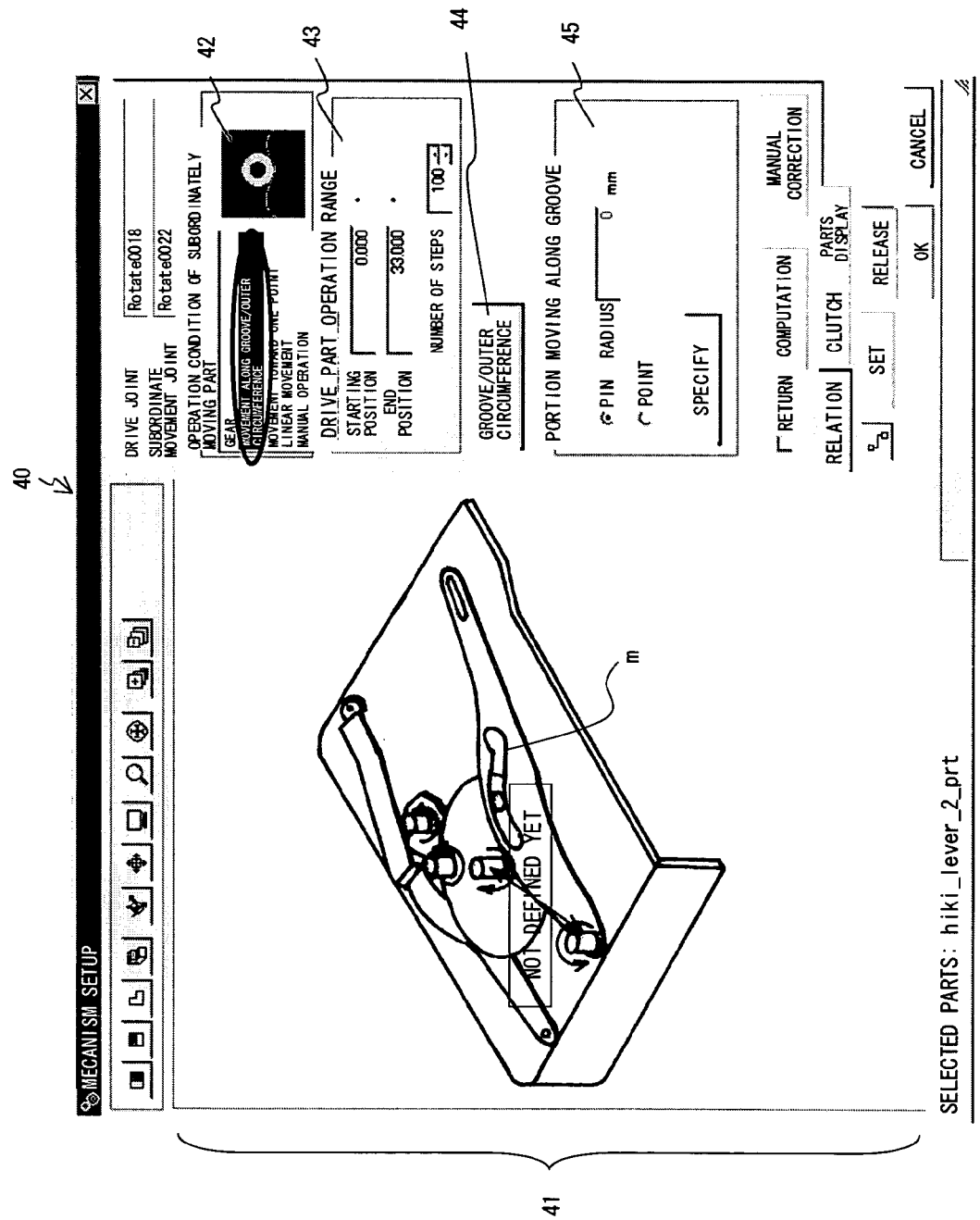
FIG. 20 shows the progression (5) of the displayed GUI screen.
Figure 26:
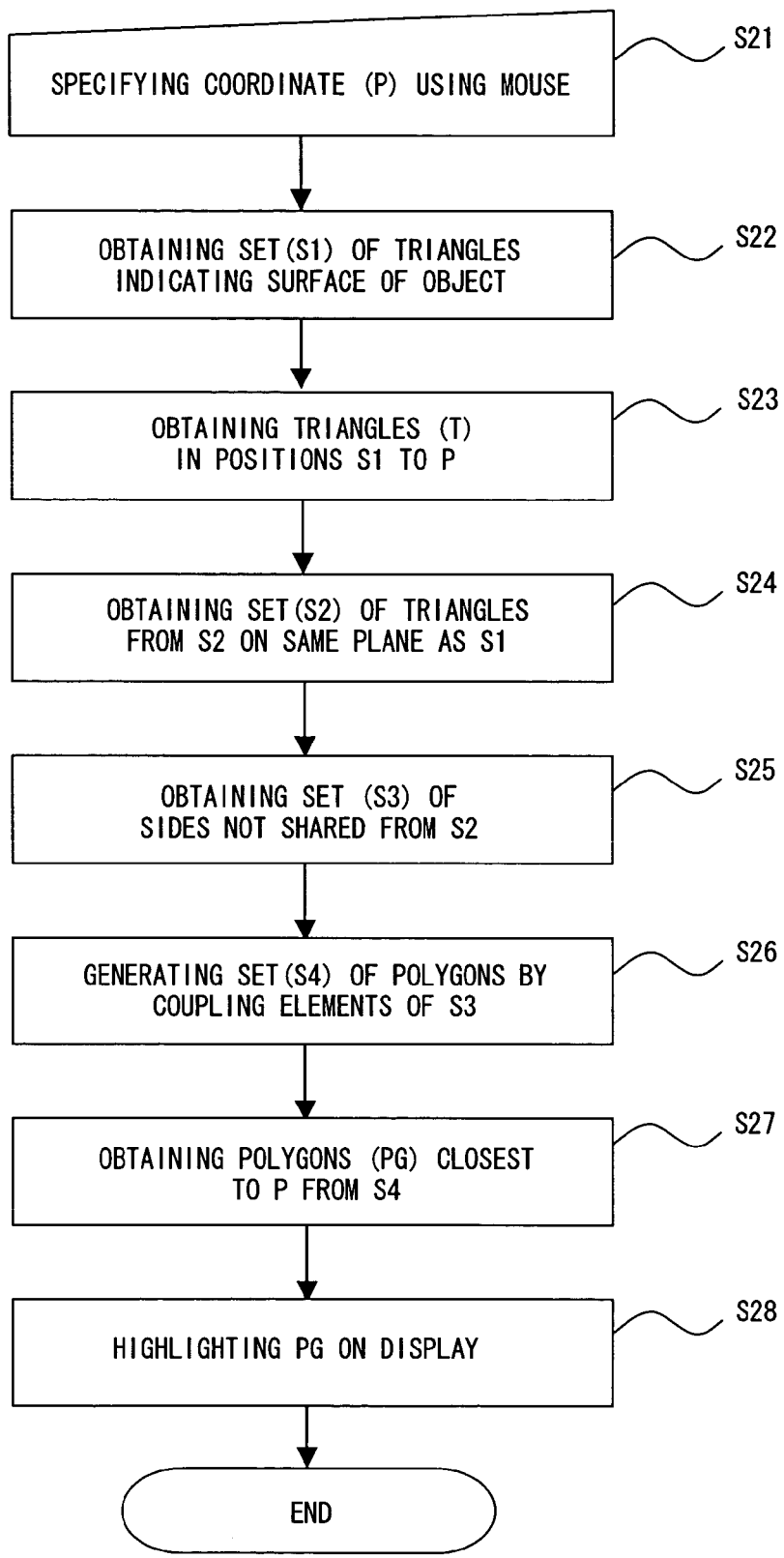
FIG. 26 is a flowchart for explanation of the process of displaying with high intensity a shape prescribing geometric bindings.

In response to the specification, by performing the process explained by referring to FIG. 26 in detail, the binding shape (outline of the groove m) can be displayed with high intensity (highlighted, etc.) as shown in FIG. 20 (step S8).

On the screen (not limited to FIG. 20, but in any other figures), no color is used, and a highlighted display can be represented by bold line.

Then, the user specifies a bound object (step S9), and the bound shape is displayed with high intensity (highlighted, etc.) (step S10).

Figure 21:
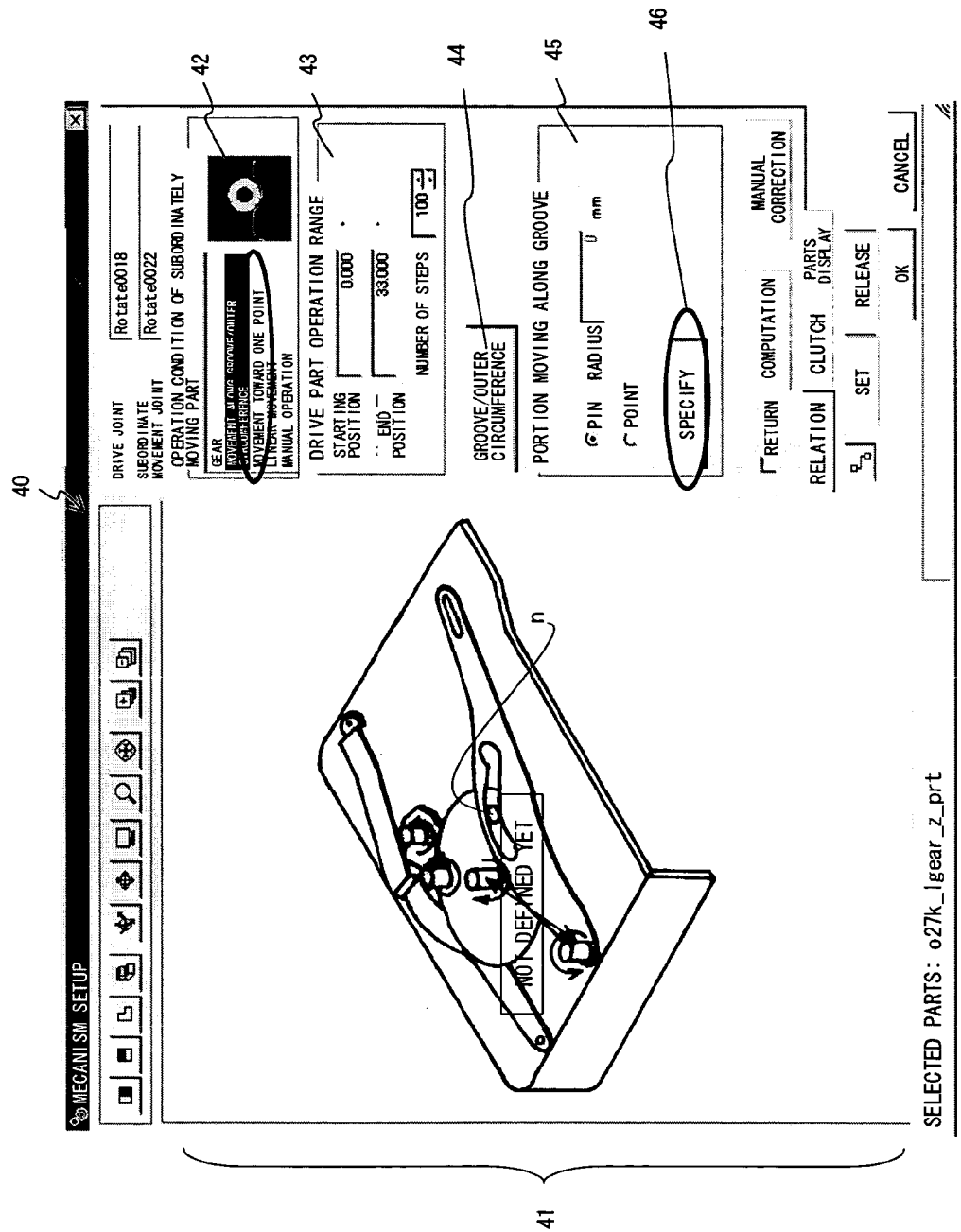
FIG. 21 shows the progression (6) of the displayed GUI screen.

In this example, the user specifies a pin n as the bound shape in the 'part moving along groove' setting area 45, and performs a clicking operation on a 'specification' button 46. In response to this specification, by the process explained in detail by referring to FIG. 26, a bound shape (outline of the pin n) is also displayed with high intensity as shown in FIG. 21 (highlighted, etc.).

Figure 22:
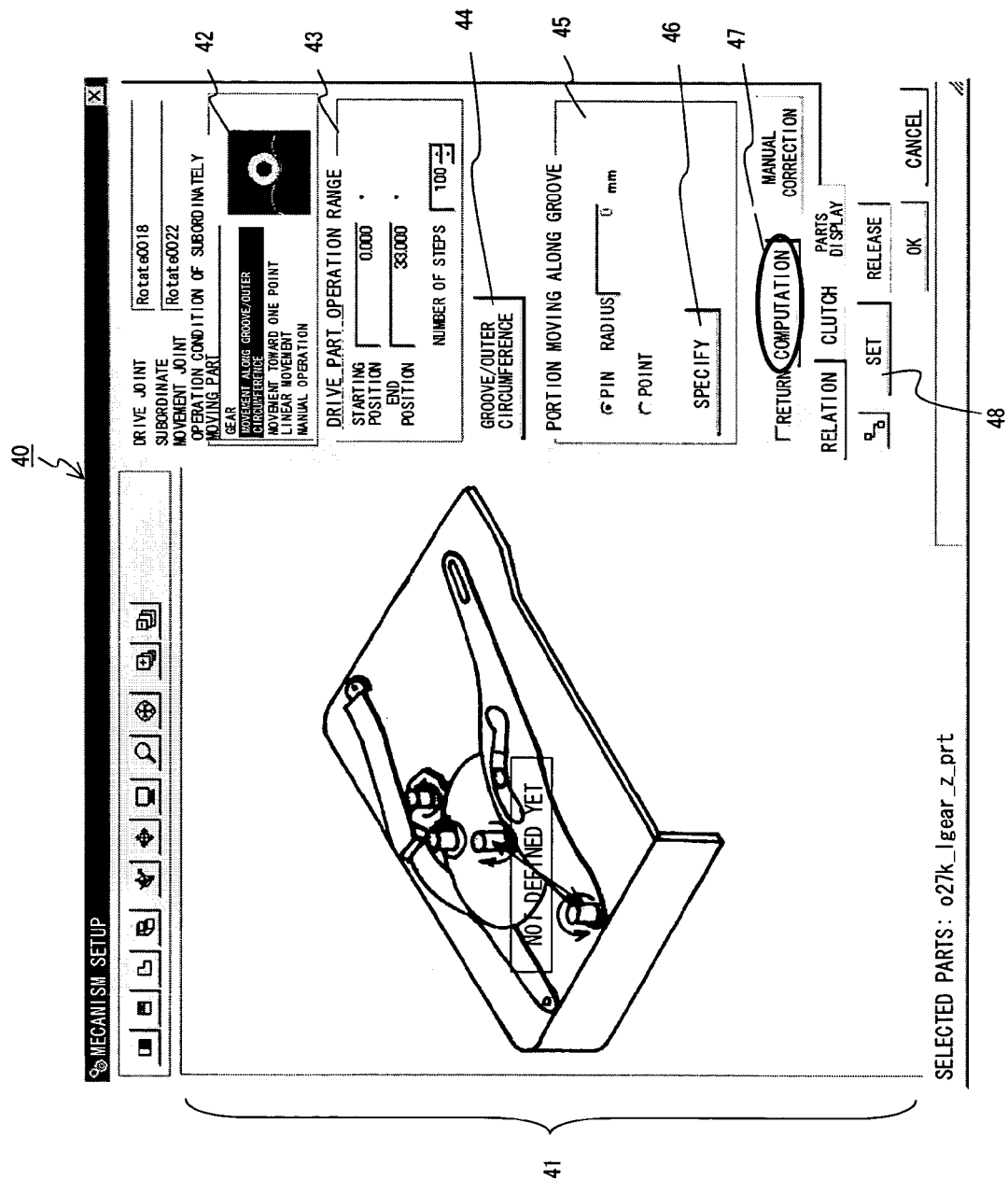
FIG. 22 shows the progression (7) of the displayed GUI screen.

After the above mentioned settings are completed, the user operates a 'computation' button 47 shown in FIG. 22 (step S11). In response to this, the system computes the interlocking operation between the drive unit and the subordinately moving unit based on the binding of the groove m. As shown in steps S12 through S15 shown in FIG. 15, d=(max−min)÷N is computed using the min, max, and N obtained in step S6. Then, the initial value of the variable i is set to 0, i=i+i (increment by +1) each time the process in steps S13 through S15 is performed, and the process is repeated until i=N. The process in steps S13 through S15 moves the drive unit (J1) by i×d (step S13), the position is computed on a bound shape (step S14), and the movement amount of the subordinately moving unit (J2) is computed (step S15). That is, for example, the automatic computing process on the interlock system using an interference check algorithm performed conventionally and other existing computing processes are performed. Therefore, the detailed explanation is not given here.

Figure 23:
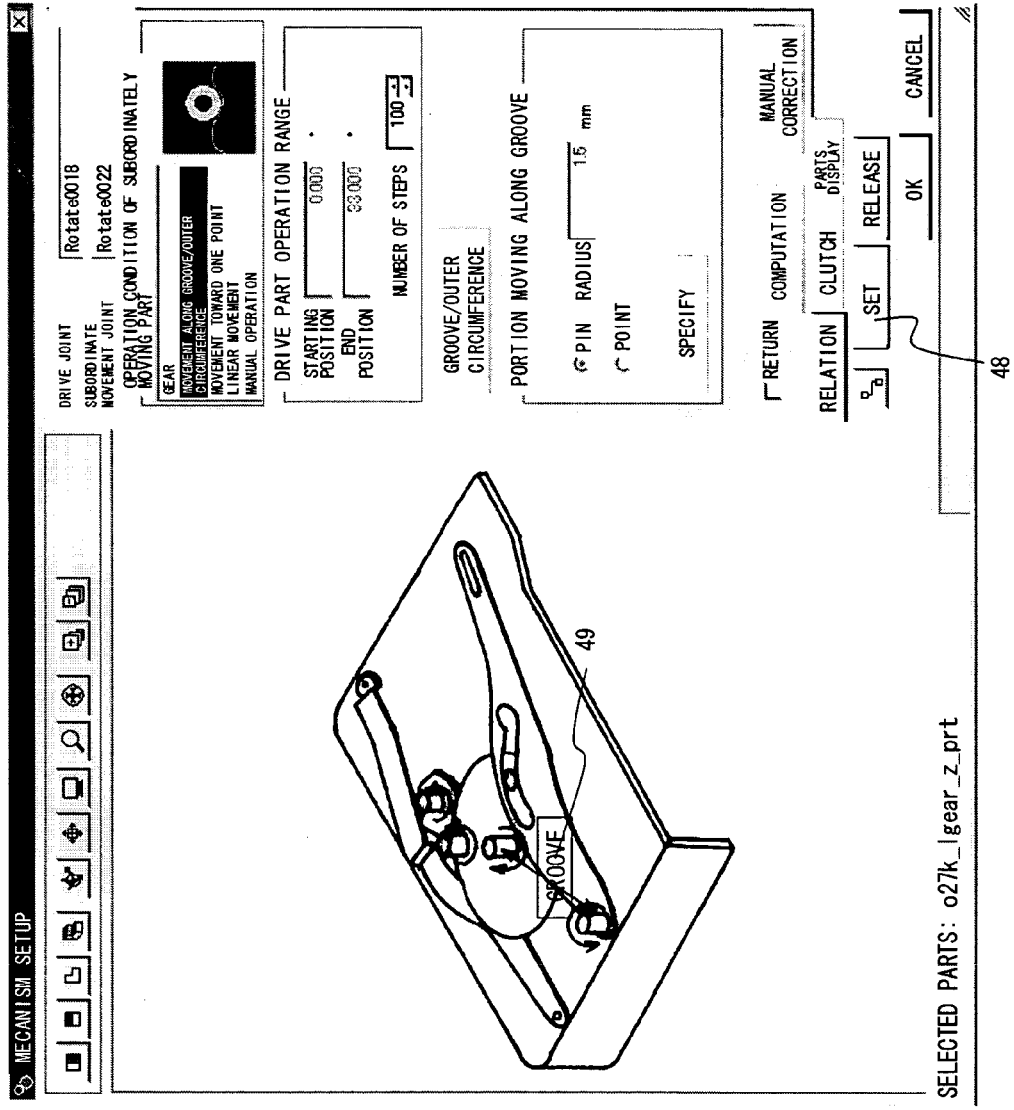
FIG. 23 shows the progression (8) of the displayed GUI screen.

As described above, when an automatic computing process on the interlocking operation is completed, the user operates a 'setting' button 48 (step S16). Thus, the system generates an interlock system table between a moving unit a and a moving unit b as shown in FIG. 25A (step S17). That is, a table showing the position of the moving unit a relative to the position of the moving unit b. Furthermore, as shown in FIG. 23, on the arrow 32 from J1 to J2, the characters (in this example, the 'groove' 49) indicating the geometric binding condition are displayed (step S18). The characters are recorded in advance and then displayed depending on the selection in the storage area unit 42.

As described above, according to the present system, the binding condition of each moving unit (traveling in parallel/rotation, direction, etc.) the geometric binding condition, the propagation of movement, etc. can be easily displayed with other parts displayed together, and the complicated operations of the mechanism can be immediately and comprehensibly displayed. Furthermore, in a simple operation (such as the dragging operation as described above, etc.), an object to be defined for an interlock system (drive unit, subordinately moving unit) can be specified.

Thus, the setting of the interlock system between the moving unit a and the moving unit b can be completed. If another interlock system is to be set, a similar process can be performed from step S1. For example, if the interlock system between the moving unit b and the moving unit c is set, the display contents appear as shown in FIG. 24.

Figure 24:
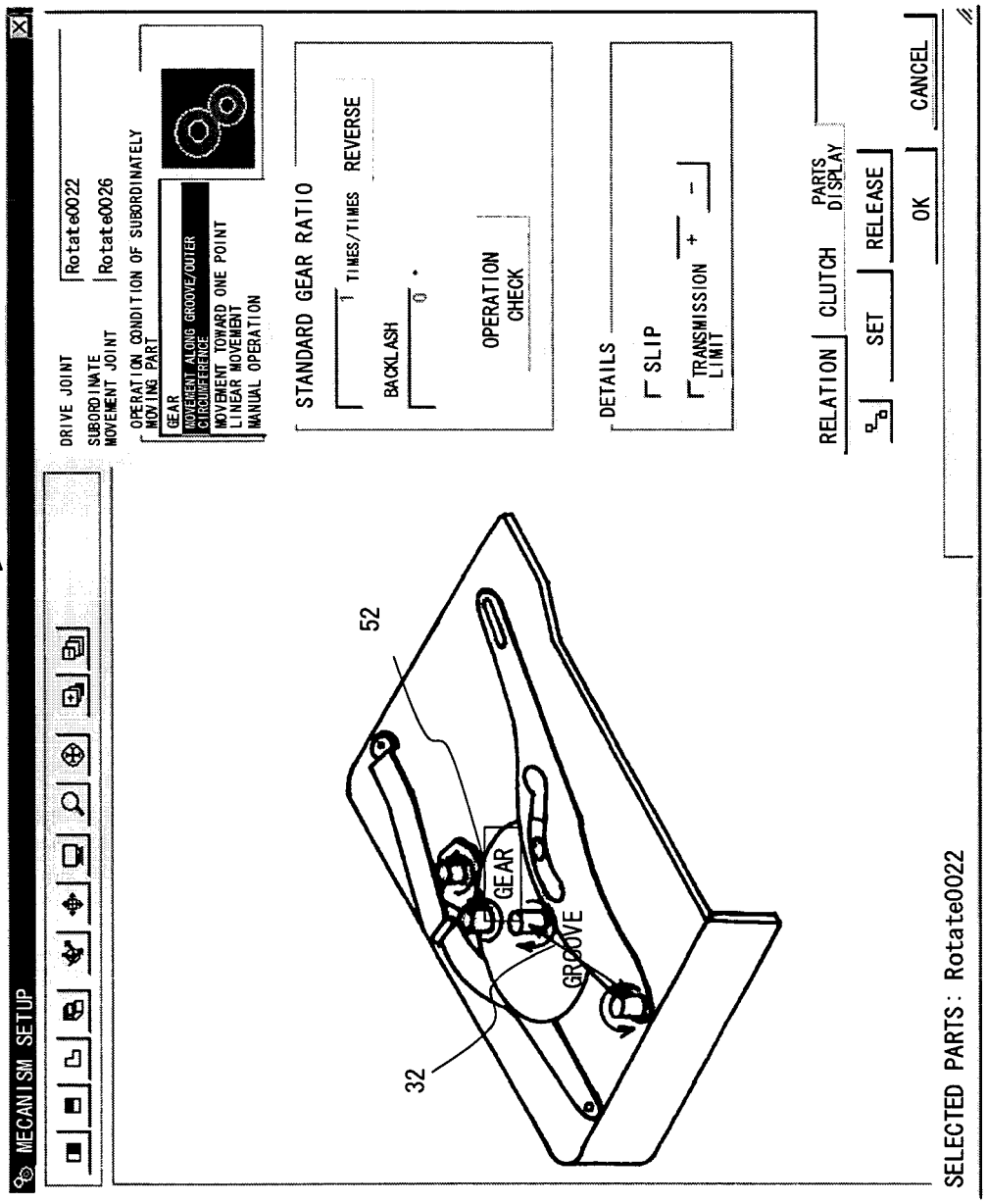
FIG. 24 shows the progression (9) of the displayed GUI screen.

As shown in FIG. 24, the characters (in this case, a 'gear') for explanation of the geometric binding condition and arrow 52 from the moving unit b to the moving unit c are displayed, and the arrow 32 from the moving unit a to the moving unit b and the 'groove' are displayed as is.

Thus, the moving unit b is interlocked (rotated) according to the geometric binding condition 'groove' from the binding condition (rotation) of the moving unit a, and then from the operation of the moving unit b, the moving unit c is interlocked according to the geometric binding condition 'gear', thereby allowing the user to easily understand the interlock system among three or more parts. Especially, a further complicated shape/interlock system can be processed with an outstanding effect.

The table of the interlock system between the moving unit b and the moving unit c can be generated and stored as shown in FIG. 25B.

Described below further in detail is the process in step S8 or S9, that is, the process of highlighting the shape (binding shape, bound shape) prescribing the geometric binding condition, by referring to FIGS. 26 and 27.

Figure 27A:
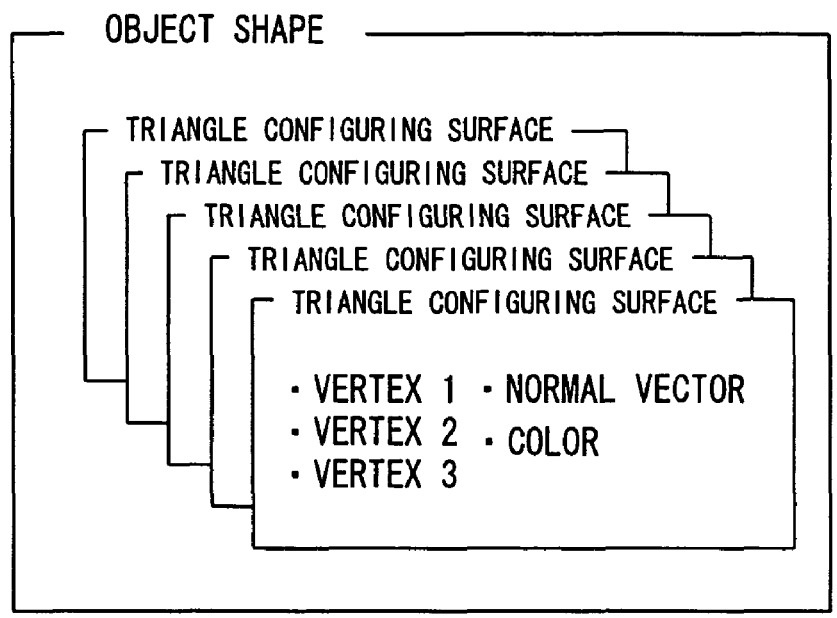
FIG. 27A shows the details of a part of shape data of each part.
Figure 27B:
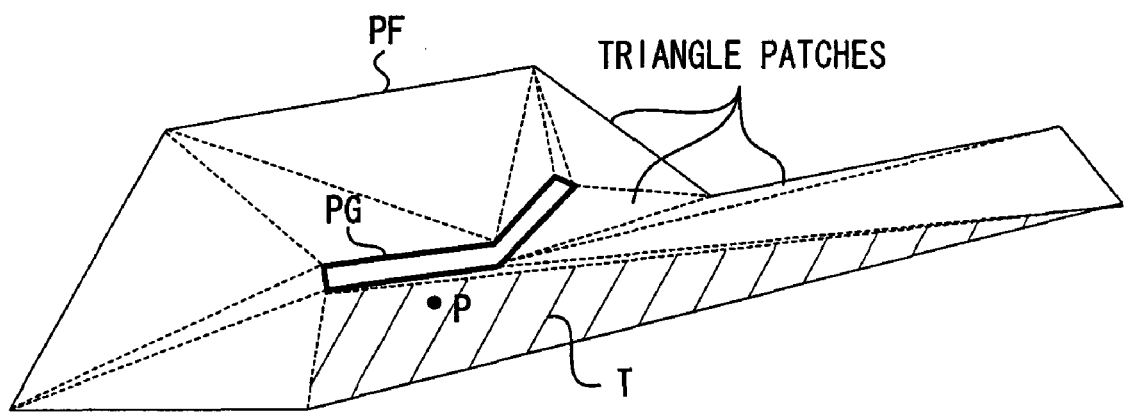
FIG. 27B shows a number of triangles (triangular patches) indicating representing the surface of a shape, and the outline of the groove m extracted therefrom.

For example, to highlight the shape of the groove m of the part A as explained by referring to FIG. 20, it is necessary to extract the outline indicating the shape of the groove m. That is, the shape data of each part is configured by a number of triangular data groups configuring the surface of the object shape as shown in FIG. 27A. Therefore, the three-dimensional CG of the shape of each part is represented by a number of triangles (triangular patches) indicating the surface of the object shape as shown in FIG. 27B. Therefore, the user can visually recognize the shape of the groove m, but the data in the system is not held as indicating the shape of the groove m itself. As a result, to highlight the groove shape, the data indicating the outline of the groove m is to be extracted.

The process in FIG. 26 is described below by referring to the example shown in FIG. 27B.

First, the user specifies an arbitrary position near the groove m using a mouse, etc. as explained above by referring to FIG. 19. In this example, it is assumed that the coordinate P shown in FIG. 27B is specified.

Thus, the system first obtains a set (S1) of triangles indicating the surface of the object shape (part A) (step S22). For example, using a dice, the set (S1) of triangles indicating the surface of the object shape refers to all triangles including all triangles indicating the surface of '1', all triangles indicating the surface of '2', . . . , all triangles indicating the surface of '6'.

Next, from the set (S1) of the triangles, the triangle (T) in the position of the coordinate P specified by the user is obtained (step S23). It is the triangle indicated by diagonal lines shown in FIG. 27B.

Then, from the set (S1) of the triangles above, the triangle on the same plane as the triangle (T) is extracted and defined as a set (S2) of triangles (in the example of a dice, for example, if the coordinate P is positioned on the plane '2', then all triangles indicating the surface of the plane '2' are extracted). FIG. 27B shows all triangles contained in the set (S2).

Based on the data of each side of all triangles contained in the set (S2), the sides not shared are extracted, and the set (S3) of sides is generated (step S25). The set (S3) of sides not shared refers to each side indicated by real line in the example shown in FIG. 27B. A shared side refers to a side indicated by a dotted line in FIG. 27B, that is, the side shared by two triangles.

Then, each side of the set (S3) is coupled if possible, thereby configuring a polygon. Sides which can be coupled to each other share a vertex (has the same vertex coordinates). Thus, in the example shown in FIG. 27B, a polygon PF indicating an outer circumference and a polygon PG indicating a groove m are generated (step S26).

Then, in the polygons generated in step S26, the polygon closest to the coordinate P specified in step S21 is determined (in this example, the polygon PG indicating the groove m), and the data (of the coupled sides) of the polygon PG is obtained and stored (step S27).

Then, the polygon PG obtained in the above mentioned process is highlighted (step S28).

FIG. 28 shows an example of the hardware configuration of a computer for realizing the above mentioned mechanical model simulator.

A computer 60 shown in FIG. 28 comprises a CPU 61, memory 62, an input device 63, an output device 64, an external storage device 65, a medium drive device 66, a network connection device 67, etc. These components are connected to a bus 68. The configuration shown in FIG. 28 is an example, and is not limited to this application.

The CPU 61 is a central processing unit for controlling the entire computer 60.

Memory 62 is memory such as RAM, etc. for temporarily storing a program or data stored in the external storage device 65 (or a portable storage medium 69) when the program is executed, data is updated, etc. The CPU 61 performs the above mentioned various processes using the program/data read to the memory 62.

The input device 63 can be, for example, a keyboard, a mouse, a touch panel, etc.

The output device 64 can be, for example, a display, a printer, etc.

Figure 1:
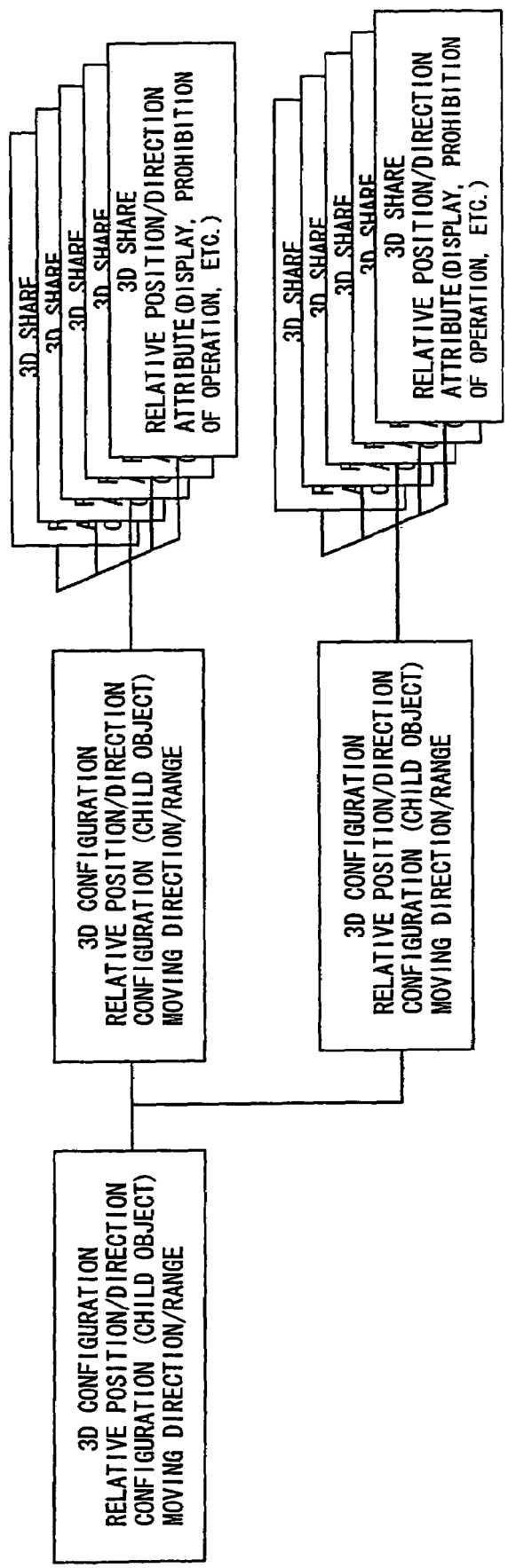
FIG. 1 shows an example of part information about shape data, etc. of each part.

The external storage device 65 can be, for example, a hardware disk device, etc., and stores the program/data (for example, the program used to direct a computer to perform each process shown in FIGS. 15 and 26, the data shown in FIG. 1, etc.) for realizing the above mentioned various functions. The program/data, etc. are stored in the portable storage medium 69, and the medium drive device 66 reads the program/data, etc. stored in the portable storage medium 69 to allow the computer 60 to perform the above mentioned various processes. The portable storage medium 69 can be, for example, an FD (flexible disk), CD-ROM, a DVD, a magneto-optical disk, etc.

The network connection device 67 is connected to a network (Internet, etc.) for communicating a program/data, etc. with an external information processing device.

Figure 29:
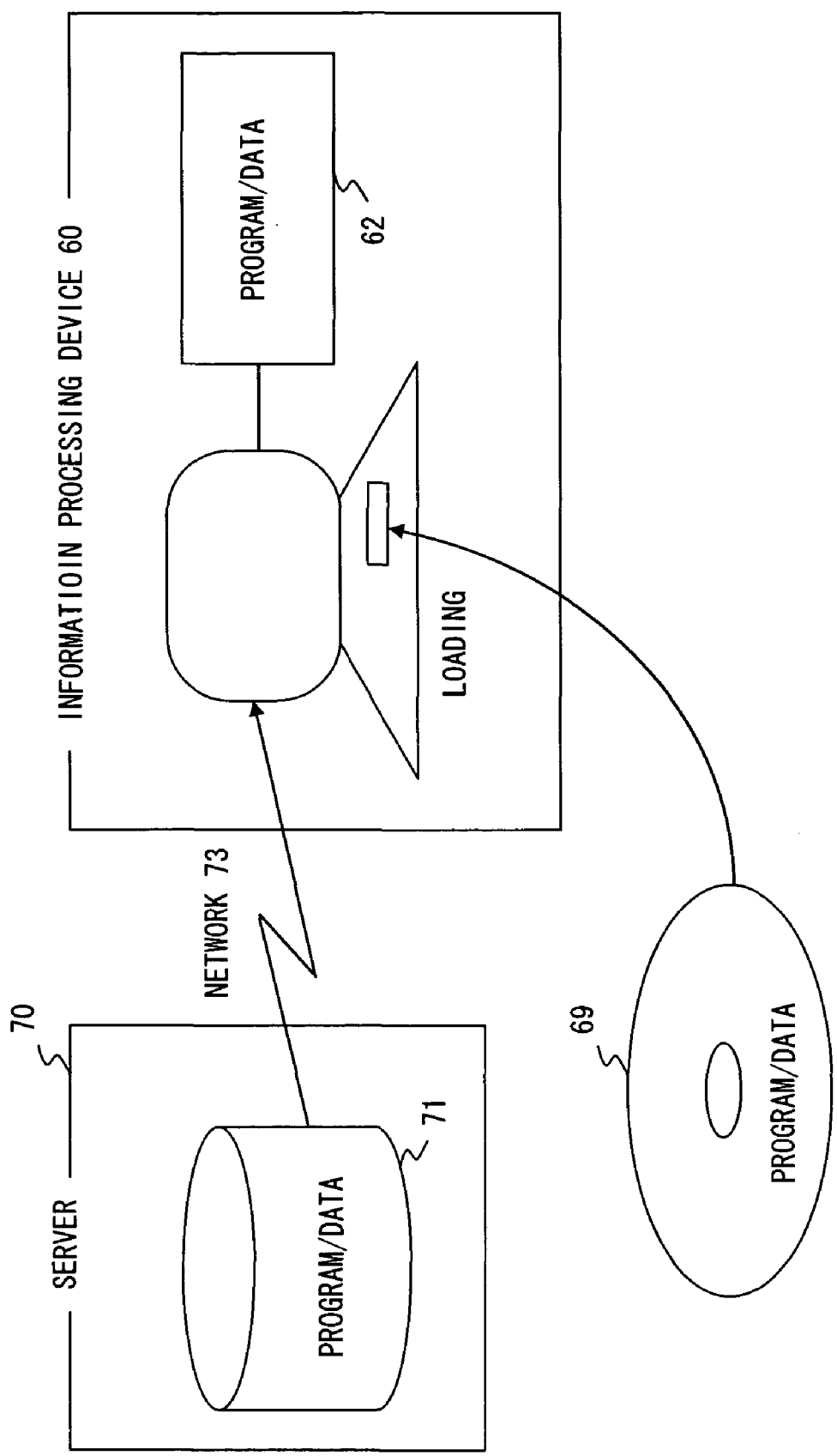
FIG. 29 shows an example of a storage medium storing the above mentioned program or downloading a program.

FIG. 29 shows an example of a storage medium storing the above mentioned program or downloading a program.

As shown in FIG. 29, the program/data is read by inserting the portable storage medium 69 storing the program/data for realizing the above mentioned functions of the present invention into the body of the computer 60, and storing the program/data in the memory 62 for execution, or the program/data can be obtained by downloading program/data 71 stored in a server 70 on the external program/data provider side through a network 73 (Internet, etc.) connected by the network connection device 67.

Furthermore, the present invention is not limited to a device or a method, but can be configured as a storage medium (portable storage medium 69, etc.) storing the above mentioned program/data, and as the above mentioned downloaded program (transmission signal).

As described above in detail, the mechanical model simulator and the program, etc. according to the present invention can output a display through which a user can easily and immediately understand the operation of the mechanism, and the operation such as a specifying operation, etc. of a drive unit and a subordinately moving unit can be easily performed.

What is claimed is:

1. A mechanical model simulation device for simplifying the display and simulation of a plurality of linked movable parts, the device comprising:
a part information storage unit storing three-dimensional shape and position information about each part and information about a movable unit of each part; and
a user interface unit displaying the three-dimensional shape of each part and a model indicating the movable unit of each part based on contents stored in the information storage unit, and specifying models of a plurality of movable units by a pointing device, thereby specifying a driving unit and a subordinately moving unit linked with the driving unit, the user interface unit further displaying a constraint condition of each movable unit and a direction of propagation of a movement of a link, specifying a geometric constraint condition, displaying the geometric constraint condition, extracting a shape determined by the specified geometric constraint condition, and displaying the extracted shape with an emphasis to facilitate viewing by the user.

2. A computer-readable storage medium storing a program used to direct a computer to perform the function of:
displaying a three-dimensional shape of each part and a model indicating a movable unit of each part based on three-dimensional shape and position information about each part stored in advance and information about the movable unit of each part;

specifying models of a plurality of movable units by a pointing device, thereby specifying a driving unit and a subordinately moving unit linked with the driving unit;

displaying a constraint condition of each movable unit and a direction of propagation of a movement of a link;

specifying a geometric constraint condition;

displaying the geometric constraint condition;

extracting a shape determined by the specified geometric constraint condition; and displaying the extracted shape with an emphasis to facilitate viewing by the user.

3. A mechanical model simulation method for simplifying the display and simulation of a plurality of linked movable parts, the method comprising:

displaying a three-dimensional shape of each part and a model indicating a movable unit of each part based on the three-dimensional shape and position information about each part stored in advance and information about the movable unit of each part;

specifying models of a plurality of movable units by a pointing device, thereby specifying a driving unit and a subordinately moving unit linked with the driving unit;

displaying a constraint condition of each movable unit and a direction of propagation of a movement of a link;

specifying a geometric constraint condition;

displaying the geometric constraint condition;

extracting a shape determined by the specified geometric constraint condition; and displaying the extracted shape with an emphasis to facilitate viewing by the user.

* * * * *